United States Patent
Inoue et al.

(10) Patent No.: US 9,249,032 B2
(45) Date of Patent: Feb. 2, 2016

(54) SEMICONDUCTOR THIN FILM, SEMICONDUCTOR THIN FILM MANUFACTURING METHOD AND SEMICONDUCTOR ELEMENT

(75) Inventors: Kazuyoshi Inoue, Chiba (JP); Futoshi Utsuno, Chiba (JP); Katsunori Honda, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 781 days.

(21) Appl. No.: 12/598,980

(22) PCT Filed: Apr. 23, 2008

(86) PCT No.: PCT/JP2008/057804
§ 371 (c)(1),
(2), (4) Date: Nov. 5, 2009

(87) PCT Pub. No.: WO2008/139860
PCT Pub. Date: Nov. 20, 2008

(65) Prior Publication Data
US 2010/0127256 A1  May 27, 2010

(30) Foreign Application Priority Data

May 7, 2007 (JP) .................... 2007-122513
May 11, 2007 (JP) .................... 2007-127132

(51) Int. Cl.
*H01L 29/10* (2006.01)
*C01G 15/00* (2006.01)
(Continued)

(52) U.S. Cl.
CPC ........ *C01G 15/00* (2013.01); *C01G 9/02* (2013.01); *C01G 15/006* (2013.01); *C01G 19/006* (2013.01); *C01G 19/02* (2013.01); *C03C 17/23* (2013.01); *C23C 14/08* (2013.01);
(Continued)

(58) Field of Classification Search
USPC ............. 257/E21.459, E29.094, 43; 438/104
See application file for complete search history.

(56) References Cited

U.S. PATENT DOCUMENTS

| 5,972,527 A | 10/1999 | Kaijou et al. | |
|---|---|---|---|
| 2005/0275038 A1* | 12/2005 | Shih et al. | ............. 257/382 |
| 2006/0110867 A1* | 5/2006 | Yabuta et al. | ............. 438/151 |

FOREIGN PATENT DOCUMENTS

| CN | 1261203 A | 7/2000 |
|---|---|---|
| CN | 1808689 A | 7/2006 |

(Continued)

OTHER PUBLICATIONS

Wolf et al., Silicon Processing for the VLSI Era: vol. I, Lattice Press, pp. 348-350 and 353.*

(Continued)

*Primary Examiner* — Marvin Payen
(74) *Attorney, Agent, or Firm* — Millen, White, Zelano & Branigan, P.C.

(57) ABSTRACT

An amorphous oxide thin film containing amorphous oxide is exposed to an oxygen plasma generated by exciting an oxygen-containing gas in high frequency. The oxygen plasma is preferably generated under the condition that applied frequency is 1 kHz or more and 300 MHz or less and pressure is 5 Pa or more. The amorphous oxide thin film is preferably exposed by a sputtering method, ion-plating method, vacuum deposition method, sol-gel method or fine particle application method.

6 Claims, 16 Drawing Sheets

(51) Int. Cl.

| | | |
|---|---|---|
| *C01G 9/02* | (2006.01) | |
| *C01G 19/00* | (2006.01) | |
| *C01G 19/02* | (2006.01) | |
| *C23C 14/08* | (2006.01) | |
| *C23C 14/58* | (2006.01) | |
| *H01L 21/02* | (2006.01) | |
| *C03C 17/23* | (2006.01) | |

(52) U.S. Cl.
CPC .............. *C23C 14/086* (2013.01); *C23C 14/58* (2013.01); *C23C 14/5826* (2013.01); *C23C 14/5853* (2013.01); *H01L 21/02554* (2013.01); *H01L 21/02565* (2013.01); *H01L 21/02573* (2013.01); *H01L 21/02581* (2013.01); *H01L 21/02592* (2013.01); *H01L 21/02631* (2013.01); *C01P 2002/50* (2013.01); *C01P 2002/72* (2013.01); *C01P 2006/40* (2013.01)
USPC .............. 257/43; 257/E21.459; 257/E29.094; 438/104

(56) References Cited

FOREIGN PATENT DOCUMENTS

| | | | |
|---|---|---|---|
| CN | 1855397 | A | 11/2006 |
| JP | 6 318406 | A | 11/1994 |
| JP | 6 318406 | W | 11/1994 |
| JP | 08264023 | A | 11/1996 |
| JP | 2005-281102 | * | 10/2005 |
| JP | 2005 281102 | A | 10/2005 |
| JP | 2005 281102 | W | 10/2005 |
| JP | 2006 165527 | A | 6/2006 |
| JP | 2006 165527 | W | 6/2006 |
| JP | 2006 165528 | A | 6/2006 |
| JP | 2006 165528 | W | 6/2006 |
| JP | 2006 165529 | A | 6/2006 |
| JP | 2006 165529 | W | 6/2006 |
| JP | 2006 165530 | A | 6/2006 |
| JP | 2006 165530 | W | 6/2006 |
| JP | 2006 165531 | A | 6/2006 |
| JP | 2006 165531 | W | 6/2006 |
| JP | 2006 165532 | A | 6/2006 |
| JP | 2006 165532 | W | 6/2006 |
| JP | 2006 173580 | A | 6/2006 |
| JP | 2006 173580 | W | 6/2006 |
| JP | 2006-299412 | | 11/2006 |
| JP | 2007 103918 | A | 4/2007 |
| JP | 2007 103918 | W | 4/2007 |
| JP | 2007-109918 | | 4/2007 |
| TW | I394852 | B | 5/2013 |
| WO | 2006070715 | A1 | 6/2006 |
| WO | WO 2007/029844 | A1 | 3/2007 |
| WO | PCTJP2008057804 | R | 6/2008 |

OTHER PUBLICATIONS

Office Action issued on Dec. 30, 2010 for Chinese Patent Application No. 200880015165.9, pp. 1-9.
English translation of Office Action issued on Dec. 30, 2010 for Chinese Patent Application No. 200880015165.9, pp. 1-9.
Abstract of Zhang et al., "Recent Progress in Transparent and Conducting Films" Feb. 2006, pp. 1-5.
Japanese Office Action dated May 21, 2013 for corresponding Japanese Application No. 2000-514069.
Abstract of JP 2007-109918, Transistor and it's Manufacturing Method, Toppan Printing Co. Ltd. Apr. 2007, 1 page.
Abstract of JP 2006-299412, Method for Forming In—Ga—Zn—O Film, Bridgestone Corp. Nov. 2006, 1 page.
Japanese Office Action dated Mar. 18, 2014 for corresponding Japanese Application No. 2009-514069.
English Abstract of JP08-264023, Publication Date: Nov. 10, 1996.
English Abstract of WO 2006/070715, Publication Date: Jun. 7, 2006.
Official Action related to corresponding Taiwanese Patent Application No. 97116317 dated Jun. 24, 2014.
Chinese Office Action dated Nov. 3, 2014; corresponding to Chinese Application No. 201310154043.
English Translation of Chinese Office Action dated Nov. 3, 2014; corresponding to Chinese Application No. 201310154043.
Chinese Office Action dated Nov. 18, 2014; corresponding to Chinese Application No. 201310154043.
English Translation of Chinese Office Action dated Nov. 18, 2014; corresponding to Chinese Application No. 201310154043.
English language abstract for CN1808689; published Jul. 26, 2006.
English language abstract for CN1855397; published Nov. 1, 2006.
English language abstract for CN1261203; published Jul. 26, 2000.

* cited by examiner

SEMICONDUCTOR THIN FILM, SEMICONDUCTOR THIN FILM MANUFACTURING METHOD AND SEMICONDUCTOR ELEMENT

TECHNICAL FIELD

The present invention relates to a semiconductor thin film, a manufacturing method thereof and a semiconductor device therewith. More particularly, the present invention relates to a semiconductor thin film obtained by exposing a thin film containing amorphous oxide to an oxygen plasma, a manufacturing method thereof and a semiconductor device therewith.

BACKGROUND ART

As semiconductors for use in transistors or the like, semiconductor thin films containing oxide such as indium oxide, gallium oxide and tin oxide have been traditionally known. Such a semiconductor thin film can be formed at low temperature as compared to a semiconductor such as silicon. Thus, a device having a substrate made of a heat-labile resin material can be designed (for instance, see Patent Documents 1 to 7).

Patent Documents 1 to 7 disclose that: an oxide film for use as a semiconductor thin film is formed of amorphous oxide that contains, for instance, indium, zinc and gallium; the amorphous oxide also contains fine crystals and has an electron carrier concentration of less than a predetermined value; and the oxide film is formed in an oxygen atmosphere having a predetermined concentration.

In addition, Patent Document 5 discloses an oxide film obtained by forming an amorphous oxide thin film and then irradiating the amorphous oxide thin film with an oxygen-containing plasma.

Patent Document 1: JP-A-2006-165527
Patent Document 2: JP-A-2006-165528
Patent Document 3: JP-A-2006-165529
Patent Document 4: JP-A-2006-165530
Patent Document 5: JP-A-2006-165531
Patent Document 6: JP-A-2006-165532
Patent Document 7: JP-A-2006-173580

DISCLOSURE OF THE INVENTION

Problems to be Solved by the Invention

However, since the oxide film formed in the oxygen atmosphere as disclosed in Patent Documents 1 to 7 is formed of amorphous oxide, its thermal stability is low and its semiconductor properties may change due to prolonged energization.

Such a problem can be solved by thermally fixing oxygen by heat. However, as far as heating is required, there are no advantages in forming a film at low temperature by utilizing amorphous properties.

In addition, oxygen that is thermally fixed in an amorphous structure is easily liberated. For instance, when a semiconductor thin film is heated under vacuum, oxygen vacancy occurs due to the liberation of oxygen. Then, carriers are increased and thus the semiconductor properties may be impaired.

Patent Document 5 does not disclose conditions for generating the oxygen-containing plasma. Thus, when the conditions for generating the oxygen-containing plasma are not appropriate, the semiconductor properties of the semiconductor thin film as the oxide film may be impaired by irradiation of the oxygen-containing plasma.

In view of the above problems, an object of the invention is to provide an amorphous semiconductor thin film and a crystalline semiconductor thin film manufactured without being heated and having high semiconductor properties resistant to heat and prolonged energization, a manufacturing method thereof, and a semiconductor device therewith.

Means for Solving the Problems

A semiconductor thin film according to an aspect of the invention contains an amorphous oxide thin film containing amorphous oxide, the semiconductor thin film being obtained by exposing the amorphous oxide thin film to an oxygen plasma generated by exciting an oxygen-containing gas in high frequency.

According to the aspect of the invention, the oxygen plasma is efficiently generated in high frequency. Also, the oxygen plasma is generated by exciting the oxygen-containing gas. Accordingly, the amorphous oxide thin film is efficiently oxidized.

The amorphous oxide thin film is oxidized by the oxygen plasma (low-temperature plasma) at low temperature. Since the surface and inside of such a semiconductor thin film are easily oxidized, the semiconductor thin film easily becomes stable against heat and prolonged energization. Thus, the semiconductor thin film has stable semiconductor properties.

Oxygen fixed by the oxygen plasma is not easily liberated as compared to oxygen fixed during film formation. Accordingly, in the semiconductor thin film, carriers are hardly increased by the liberation of oxygen and thus the semiconductor properties are hardly impaired.

Further, since the temperature of a substrate can be maintained at low temperature of 200 degrees C. or less by using the plasma, the semiconductor thin film can be formed on a substrate of low heat resistance such as a film.

Preferably in the aspect of the invention, the oxygen plasma is generated under a condition that applied frequency is 1 kHz or more and 300 MHz or less.

The applied frequency is preferably 100 kHz or more and 100 MHz or less, more preferably 1 MHz or more and 50 MHz or less. An RF plasma of 13.56 MHz is most preferable. The input power is 100 W or more, preferably 300 W or more.

When the applied frequency is not in the range of 1 kHz to 300 MHz, the oxygen plasma may not be stable. In addition, a substrate forming a semiconductor thin film or the formed semiconductor thin film itself may be unfavorably heated by a high frequency electric field.

Thus, the oxygen plasma can be stably generated when the applied frequency is 1 kHz or more and 300 MHz or less.

Preferably in the aspect of the invention, the oxygen plasma is generated under a condition that pressure is 5 Pa or more and 0.1 MPa or less.

The pressure is more preferably 50 Pa or more and less than 0.01 MPa, further more preferably 100 Pa or more and less than 1000 Pa.

When the pressure is less than 5 Pa, the amorphous oxide thin film may not be effectively oxidized. Also, when the amorphous oxide thin film is crystallized as will be described later, the progression of the crystallization may be retarded. When the pressure exceeds 0.1 MPa, the temperature of the oxygen plasma may be increased and thus the substrate may be overheated.

Consequently, under the condition that the pressure is 5 Pa or more and 0.1 MPa or less, the oxygen plasma can be stably generated.

Preferably in the aspect of the invention, the amorphous oxide thin film is formed by one of a sputtering method, ion-plating method, vacuum deposition method, sol-gel method and fine particle application method.

Because heating treatment is not required in forming the amorphous oxide thin film according to the aspect of the invention, a heat-labile resin material can be used as the substrate. When a vacuum device is used, the sputtering method is effective. The sol-gel method and fine particle application method are also effective for forming the film at low cost.

Further, the spattering method is effective for forming the film on a large substrate or for ensuring smoothness and uniformity of the surface of the film.

Preferably in the aspect of the invention, the amorphous oxide thin film is a thin film containing indium oxide as a main component, and the amorphous oxide thin film contains positive trivalent metal oxide other than indium oxide.

The "main component" herein means a composition in which the content of the indium oxide exceeds 50 mass % in total metal oxides. When positive trivalent metal is referred to as N, the atomic ratio of $In/(In+N)$ is 0.5 or more and 0.95 or less, preferably 0.6 or more and 0.9 or less.

When the atomic ratio is less than 0.5, the mobility of the semiconductor thin film may be reduced. On the other hand, when the ratio is more than 0.95, the semiconductor thin film may be crystallized.

Thus, the semiconductor thin film according to the aspect of the invention becomes amorphous while having high mobility.

Preferably in the aspect of the invention, the positive trivalent metal oxide is at least one or more of metal oxides selected from boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

Because the amorphous oxide thin film is easily oxidized according to the aspect of the invention, the semiconductor thin film becomes amorphous. Further, the semiconductor thin film stably functions because oxygen vacancy does not easily occur.

Preferably in the aspect of the invention, the amorphous oxide thin film contains indium oxide and positive divalent metal oxide as main components.

The "main component" herein means a composition in which the content of the indium oxide and positive divalent metal oxide exceeds 50 mass % in total metal oxides. When positive divalent metal is referred to as M, the atomic ratio of $In/(In+M)$ is 0.2 or more and 0.95 or less, preferably 0.5 or more and 0.9 or less, in the composition of the indium oxide and positive divalent metal oxide.

When the atomic ratio is less than 0.2 or more than 0.95, the semiconductor thin film may be crystallized by plasma treatment.

According to the aspect of the invention, the semiconductor thin film can be stably amorphous because the amorphous oxide thin film is easily oxidized.

Preferably in the aspect of the invention, the positive divalent metal oxide is at least one or more of metal oxides selected from zinc oxide and magnesium oxide.

The mobility of carriers of the amorphous oxide thin film is not easily reduced according to the aspect of the invention. Also, the semiconductor thin film effectively becomes amorphous by the oxygen plasma.

Preferably in the aspect of the invention, the amorphous oxide thin film contains at least one or more of metal oxides selected from boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

The oxygen vacancy is further easily reduced in the amorphous oxygen thin film according to the aspect of the invention. Thus, the semiconductor thin film easily becomes amorphous.

Preferably in the aspect of the invention, the amorphous oxide thin film contains zinc oxide and tin oxide as main components.

The "main components" herein means a composition in which the content of the zinc oxide and tin oxide exceeds 50 mass % in total metal oxides.

In the composition of the zinc oxide and tin oxide, the atomic ratio of $Zn/(Zn+Sn)$ is 0.1 or more and 0.9 or less, preferably 0.2 or more and 0.8 or less.

When the atomic ratio is less than 0.1 or more than 0.9, the semiconductor thin film may be crystallized by plasma treatment.

Because the amorphous oxide thin film is easily oxidized according to the aspect of the invention, the semiconductor thin film easily becomes stably amorphous.

Preferably in the aspect of the invention, the amorphous oxide thin film contains positive trivalent metal oxide.

The semiconductor thin film easily becomes amorphous because the amorphous oxide thin film is easily oxidized according to the aspect of the invention. Further, the semiconductor thin film stably functions because the oxygen vacancy does not easily occur.

Preferably in the aspect of the invention, the positive trivalent metal oxide is at least one or more of metal oxides selected from boron oxide, aluminum oxide, gallium oxide, indium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

The semiconductor thin film easily becomes amorphous because the amorphous oxide thin film is easily oxidized according to the aspect of the invention. Further, the semiconductor thin film stably functions because the oxygen vacancy does not easily occur.

Preferably in the aspect of the invention, the amorphous oxide thin film contains indium oxide and tin oxide as main components.

The "main components" herein means a composition in which the content of the indium oxide and tin oxide exceeds 50 mass % in total metal oxides.

In the composition of the indium oxide and tin oxide, the atomic ratio of $In/(In+Sn)$ is 0.2 or more and 0.8 or less, preferably 0.5 or more and 0.7 or less.

When the atomic ratio is less than 0.2 or more than 0.8, the semiconductor thin film may be crystallized.

Because the amorphous oxide thin film is easily oxidized according to the aspect of the invention, the semiconductor thin film has high mobility and becomes amorphous.

Preferably in the aspect of the invention, the amorphous oxide thin film contains positive trivalent metal oxide other than indium oxide.

According to the aspect of the invention, the amorphous oxide thin film maintains a stable amorphous structure. Accordingly, the amorphous oxide thin film is easily oxidized and thus the semiconductor thin film easily becomes amorphous. Also, the semiconductor thin film has stable semiconductor properties because the oxygen vacancy does not easily occur.

Preferably in the aspect of the invention, the positive trivalent metal oxide is at least one or more of metal oxides selected from boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

The semiconductor thin film easily becomes amorphous because the amorphous oxide thin film is easily oxidized according to the aspect of the invention. Further, the oxide semiconductor stably functions because the oxygen vacancy does not easily occur.

Preferably in the aspect of the invention, the amorphous oxide thin film contains positive divalent metal oxide.

According to the aspect of the invention, the amorphous oxide thin film maintains a stable amorphous structure. Accordingly, the amorphous oxide thin film is easily oxidized and thus the semiconductor thin film easily becomes amorphous. Further, because the oxygen vacancy does not easily occur, the semiconductor thin film has stable semiconductor properties.

Preferably in the aspect of the invention, the positive divalent metal oxide is at least one or more of metal oxides selected from zinc oxide and magnesium oxide.

The mobility of carriers of the amorphous oxide thin film is not easily reduced according to the aspect of the invention. Thus, the semiconductor thin film effectively becomes amorphous.

Preferably in the aspect of the invention, the amorphous oxide thin film is a thin film containing indium oxide as a main component and is crystallized by being exposed to the oxygen plasma.

According to the aspect of the invention, the amorphous oxide thin film containing the indium oxide as the main component is exposed to the oxygen plasma to obtain a crystalline indium oxide semiconductor thin film.

The crystallization can occur without heating indium oxide, so that a semiconductor thin film having high stability against heat and prolonged energization can be obtained.

In addition, the oxygen vacancy is reduced during the crystallization of indium oxide because oxygen is fixed to the semiconductor thin film by the oxygen plasma. Thus, a semiconductor thin film having excellent semiconductor properties can be obtained.

Further, the oxygen crystallized and fixed by the oxygen plasma is not easily liberated as compared to thermally fixed oxygen. Thus, carriers are hardly increased by the liberation of oxygen and thus the semiconductor properties are hardly impaired.

Because the semiconductor thin film according to the aspect of the invention is formed without heating treatment, the semiconductor thin film can be formed on a heat-labile resin substrate while having excellent semiconductor properties.

The semiconductor thin film according to the aspect of the invention is applicable to a drive element of a thin display device having a substrate made of a flexible resin material because the heating treatment is not required during and after the film formation and the indium oxide thin film is transparent.

Incidentally, the amorphous indium oxide contained in the amorphous oxide thin film may be an amorphous material containing fine crystals or a completely amorphous material. The "amorphous material containing fine crystals" or the "completely amorphous material" herein means a material in which no peak is observed in X-ray diffraction or a material in which only small peaks are observed in X-ray diffraction of the crystallized thin film.

Also, the "main component" herein means a composition in which the content of the indium oxide is 50 mass % or more in the amorphous oxide thin film. The content of the indium oxide is preferably 70 mass % or more, and more preferably 80 mass % or more.

Preferably in the aspect of the invention, the amorphous oxide thin film contains positive divalent metal oxide.

According to the aspect of the invention, the positive divalent metal oxide effectively inhibits the generation of carriers in the semiconductor thin film. Thus, a semiconductor thin film that stably functions for a long period can be obtained.

Preferably in the aspect of the invention, the positive divalent metal oxide is at least one or more of metal oxides selected from zinc oxide, magnesium oxide, nickel oxide, copper oxide and cobalt oxide.

According to the aspect of the invention, the generation of carriers can be effectively inhibited and thus a semiconductor thin film that stably functions for a long period can be obtained.

Incidentally, addition of iron oxide or manganese oxide provides no advantage.

Preferably in the aspect of the invention, the amorphous oxide thin film contains positive trivalent metal oxide.

The oxygen vacancy is reduced by the positive trivalent metal oxide during the crystallization of indium oxide according to the aspect of the invention. Thus, a semiconductor thin film that stably functions can be obtained.

Preferably in the aspect of the invention, the positive trivalent metal oxide is at least one or more of metal oxides selected from boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

According to the aspect of the invention, the oxygen vacancy is reduced more effectively and a semiconductor thin film that stably functions can be obtained.

Incidentally, addition of thallium oxide or the like may easily lead to the oxygen vacancy, and thus provide no advantage.

A method of manufacturing a semiconductor thin film according to another aspect of the invention includes exposing an amorphous oxide thin film containing amorphous oxide to an oxygen plasma generated by exciting an oxygen-containing gas in high frequency.

Because the amorphous oxide thin film is oxidized by the oxygen plasma according to the aspect of the invention, a semiconductor thin film in which oxygen vacancy is reduced can be obtained at low temperature. Since the surface and inside of such a semiconductor thin film are easily oxidized, the oxygen vacancy in the semiconductor thin film is efficiently reduced. Thus, a semiconductor thin film having stable semiconductor properties can be obtained.

In addition, a semiconductor thin film having low carrier density can be efficiently manufactured because the oxygen vacancy can be reduced by the oxygen plasma. Further, because the temperature of a substrate can be maintained at low temperature of 200 degrees C. or less by using the plasma, the semiconductor thin film can be formed on a substrate of low heat resistance such as a film.

Furthermore, because oxygen fixed by the oxygen plasma is not easily liberated as compared to oxygen fixed during film formation, carriers are hardly increased by the liberation of oxygen and thus the semiconductor properties are hardly impaired.

A semiconductor device according to still further aspect of the invention includes the above-described semiconductor thin film.

The semiconductor device can stably function because the semiconductor thin film has stable semiconductor properties.

The semiconductor device can be used as, for instance, a transistor because the semiconductor device has the semiconductor thin film.

BEST MODE FOR CARRYING OUT THE INVENTION

First Exemplary Embodiment

Figure 1:
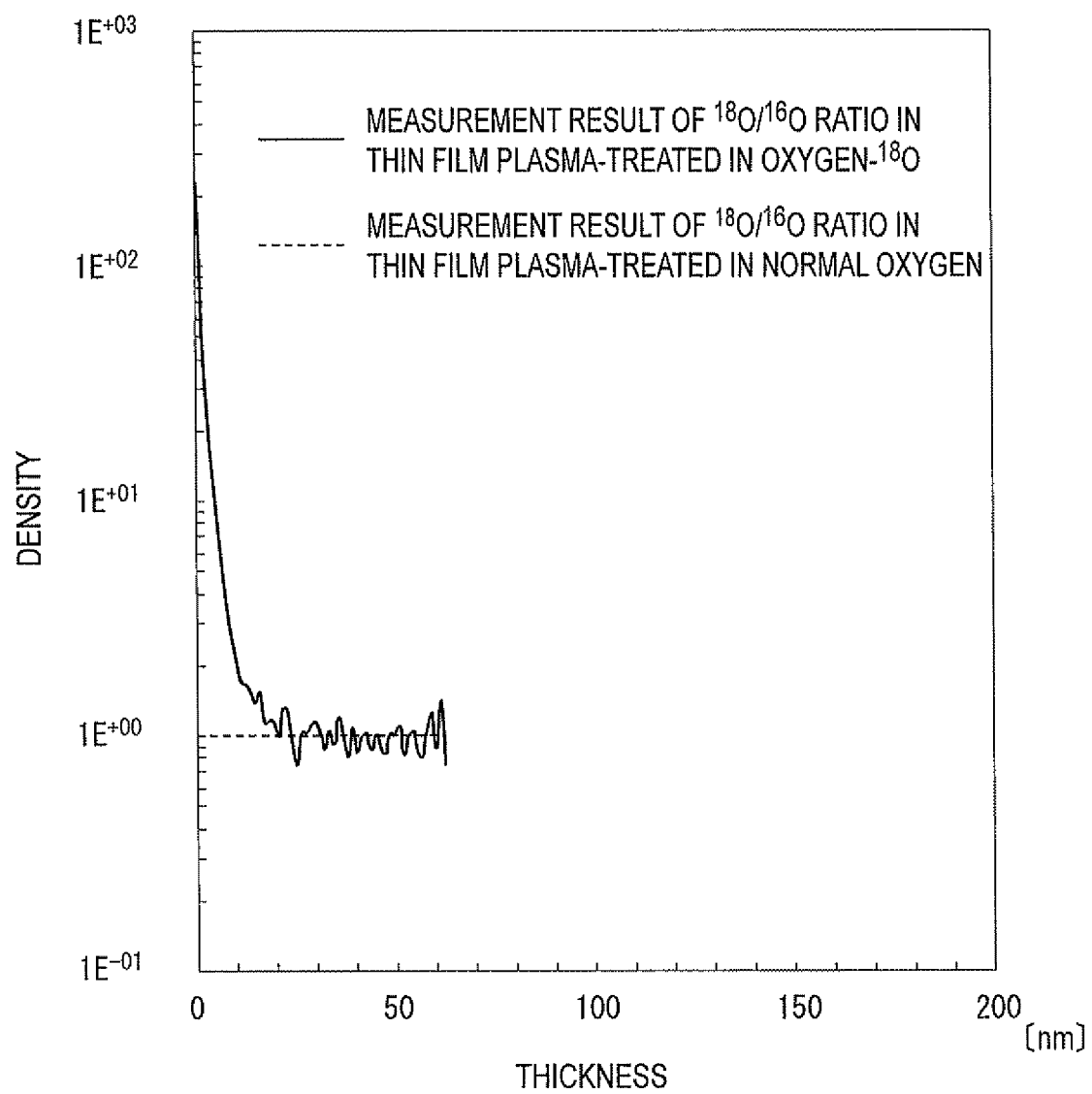
FIG. 1 shows a relationship between a ratio of $^{18}O/^{16}O$ in a thin film of Example 1-2 and a ratio of $^{18}O/^{16}O$ in a thin film of Comparative 1-2 according to a first exemplary embodiment of the invention.

In a first exemplary embodiment, an amorphous semiconductor thin film is formed by exposing an amorphous oxide thin film containing amorphous oxide to an oxygen plasma generated by exciting an oxygen-containing gas in high frequency.

The first exemplary embodiment of the invention will be described below.

[Amorphous Oxide Thin Film]

The amorphous oxide thin film of the first exemplary embodiment contains indium oxide as a main component and also contains positive trivalent metal oxide. The "main component" herein means a composition in which the content of the indium oxide exceeds 50 mass %.

Also, when positive trivalent metal is referred to as N, the atomic ratio of In/(In +N) is 0.5 or more and 0.95 or less, preferably 0.6 or more and 0.9 or less.

When the atomic ratio is less than 0.5, the mobility may be lowered. When the atomic ratio is more than 0.95, the amorphous oxide thin film may provide a crystallized semiconductor thin film.

Examples of the positive trivalent metal oxide include boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

The amorphous oxide thin film may contain single one of the above positive trivalent metal oxides, or may contain two or more thereof.

The amorphous oxide thin film of the first exemplary embodiment may contain indium oxide and a positive divalent metal compound as main components.

The "main components" herein means a composition in which the content of the indium oxide and positive divalent metal compound exceeds 50 mass %.

When positive divalent metal is referred to as M, the atomic ratio of In/(In +M) is 0.2 or more and 0.95 or less, preferably 0.5 or more and 0.9 or less, in the composition of the indium oxide and positive divalent metal compound.

When the atomic ratio is less than 0.2 or more than 0.95, crystallization may occur due to plasma treatment.

Preferably, the positive divalent metal oxide is zinc oxide or magnesium oxide. The amorphous oxide thin film may contain one or both of zinc oxide and magnesium oxide.

The amorphous oxide thin film containing indium oxide and a positive divalent metal compound as the main components may further contain at least one or more of metal oxides selected from boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

The amorphous oxide thin film of the first exemplary embodiment may contain zinc oxide and tin oxide as main components.

Specifically, the "main components" herein means a composition in which the content of the zinc oxide and tin oxide exceeds 50 mass %.

In the composition of the zinc oxide and tin oxide, the atomic ratio of Zn/(Zn+Sn) is 0.1 or more and 0.9 or less, preferably 0.2 or more and 0.8 or less.

When the atomic ratio is less than 0.1 or more than 0.9, the amorphous oxide thin film may provide a crystallized semiconductor thin film.

The amorphous oxide thin film containing zinc oxide and tin oxide as the main components may further contain positive trivalent metal oxide.

Examples of the positive trivalent metal oxide include boron oxide, aluminum oxide, gallium oxide, indium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

The amorphous oxide thin film may contain single one of the above positive trivalent metal oxides, or may contain two or more thereof.

The amorphous oxide thin film of the first exemplary embodiment may contain indium oxide and tin oxide as main components.

Specifically, the "main components" herein means a composition in which the content of the indium oxide and tin oxide exceeds 50 mass %.

In the composition of the indium oxide and tin oxide, the atomic ratio of In/(In+Sn) is 0.2 or more and 0.8 or less, preferably 0.5 or more and 0.7 or less.

When the atomic ratio is less than 0.2 or more than 0.8, the amorphous oxide thin film may provide a crystallized semiconductor thin film.

The amorphous oxide thin film containing indium oxide and tin oxide as the main components may further contain positive trivalent metal oxide. Examples of the positive trivalent metal oxide include boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

The amorphous oxide thin film may contain single one of the above positive trivalent metal oxides, or may contain two or more thereof.

The amorphous oxide thin film containing indium oxide and tin oxide as the main components may further contain positive divalent metal oxide.

Preferably, the positive divalent metal oxide is zinc oxide or magnesium oxide. The amorphous oxide thin film may contain one or both of zinc oxide and magnesium oxide.

The amorphous oxide thin film of the first exemplary embodiment is formed on a substrate by a sputtering method, ion-plating method, vacuum deposition method, sol-gel method or fine particle application method. When a vacuum device is used, the sputtering method is effective. The sol-gel method and fine particle application method are also effective to form the film at low cost.

Examples of the substrate include a glass substrate such as an alkali-free glass, alkali glass and soda-lime glass, and a plastic film such as a polycarbonate film, polyarylate film, polyethersulfone film, polymethylmethacrylate film, polyethylene terephthalate film, polyethylene naphthalate film, polyacetylcellulose film and polystyrene film.

Since the semiconductor thin film can be formed without heating treatment, a heat-labile resin material may be used as the substrate.

[Treatment by Oxygen Plasma]

An oxygen plasma used for manufacturing the amorphous semiconductor in the first exemplary embodiment is a high-frequency plasma generated by exciting an oxygen-containing gas.

The oxygen plasma is generated under the condition that applied frequency is 1 kHz or more and 300 MHz or less and pressure is 5 Pa or more and 0.1 MPa or less.

When the applied frequency is less than 1 kHz, the oxygen plasma may not be stable. When the applied frequency is more than 300 MHz, the oxygen plasma may not be generated or may be unstable. In addition, by applying a high frequency electric field, the substrate for forming the semiconductor thin film or the formed thin film itself may be heated.

The applied frequency is preferably 100 kHz or more and 100 MHz or less, more preferably 1 MHz or more and 50 MHz or less. An RF plasma of 13.56 MHz is most preferable.

When the pressure is less than 5 Pa, oxidization may not effectively occur.

The input power is 100 W or more, preferably 300 W or more.

Advantages of First Exemplary Embodiment

According to the first exemplary embodiment, the following advantages can be attained.

(1) In the first exemplary embodiment, the amorphous semiconductor thin film can be obtained by exposing the amorphous oxide thin film containing the amorphous oxide with the above-described atomic ratio to the oxygen plasma generated by exciting the oxygen-containing gas in high frequency.

Since the amorphous oxide thin film is oxidized by the oxygen plasma at low temperature, the semiconductor thin film easily becomes amorphous.

Such an amorphous semiconductor film has stable semiconductor properties because the surface and inside of the semiconductor thin film are easily oxidized.

Oxygen fixed by the oxygen plasma is not easily liberated as compared to oxygen fixed in the formation of the film. Thus, in the semiconductor thin film, carriers are hardly increased by the liberation of oxygen and thus the semiconductor properties are hardly impaired.

Further, since the temperature of the substrate can be maintained at low temperature of 200 degrees C. or less by using the plasma, the semiconductor thin film can be formed on a substrate of low heat resistance such as a film.

(2) Since the oxygen plasma is a high-frequency plasma in the first exemplary embodiment, the oxygen plasma can be effectively generated.

The condition for generating the oxygen plasma is that the applied frequency is 1 kHz or more and 300 MHz or less and the pressure is 5 Pa or more and 0.1 MPa or less. Thus, the oxygen plasma can be stably generated and therefore a semiconductor thin film that stably functions can be obtained without heating the amorphous oxide thin film.

(3) Since the oxygen-containing gas is excited to generate the oxygen plasma in the first exemplary embodiment, the oxygen plasma is incorporated into the amorphous oxide thin film. Accordingly, the amorphous oxide thin film containing the amorphous oxide with the atomic ratio described above in the first exemplary embodiment is effectively oxidized. Thus, a semiconductor thin film that easily becomes amorphous can be obtained.

(4) Since the amorphous oxide thin film is formed by the sputtering method, ion-plating method, vacuum deposition method, sol-gel method or fine particle application method in the first exemplary embodiment, heating treatment is not required in forming the amorphous oxide thin film. Thus, for instance, a heat-labile resin material can be used as the substrate.

(5) The amorphous oxide thin film contains indium oxide as the main component and also contains positive trivalent metal oxide in the first exemplary embodiment. When indium oxide is referred to as In and positive trivalent metal is referred to as N, the atomic ratio of $In/(In +N)$ is 0.5 or more and 0.95 or less. Thus, an amorphous semiconductor thin film having high mobility can be obtained.

Since the content of the indium oxide in total metal oxides exceeds 50 mass % and the atomic ratio of $In/(In +N)$ is 0.95 or less, the mobility of the amorphous semiconductor thin film is not easily reduced. In addition, the semiconductor thin film is not easily crystallized.

The amorphous oxide thin film containing indium oxide as the main component is easily oxidized by further containing positive trivalent metal oxide such as boron oxide. Thus, the semiconductor thin film easily becomes amorphous. Also, the semiconductor thin film can stably function because the oxygen vacancy does not easily occur.

(6) According to the first exemplary embodiment, the amorphous oxide thin film contains indium oxide and positive divalent metal oxide as the main components, and therefore the amorphous oxide thin film can be easily oxidized. When positive divalent metal is referred to as M, the atomic ratio of $In/(In +M)$ is 0.2 or more and 0.95 or less. Thus, the semiconductor thin film becomes amorphous.

In the amorphous oxide thin film containing indium oxide and positive divalent metal oxide as the main components, the positive divalent metal oxide is at least one or more of zinc oxide and magnesium oxide. Accordingly, the mobility of carriers is not easily reduced. Thus, the semiconductor thin film effectively becomes amorphous.

Also, when the amorphous oxide thin film containing indium oxide and positive divalent metal oxide as the main components further contains metal oxide such as boron oxide, the oxygen vacancy is further reduced. Thus, the semiconductor thin film becomes amorphous.

(7) According to the first exemplary embodiment, the amorphous oxide thin film contains zinc oxide and tin oxide as the main components, and therefore the film can be easily oxidized. When zinc oxide is referred to as Zn and tin oxide is referred to as Sn, the atomic ratio of $Zn/(Zn+Sn)$ is 0.1 or more and 0.9 or less. Thus, the semiconductor thin film becomes amorphous.

Further, since the atomic ratio of $Zn/(Zn+Sn)$ is 0.1 or more and 0.9 or less in the composition of the zinc oxide and tin oxide, the film is hardly crystallized.

When the amorphous oxide thin film containing zinc oxide and tin oxide as the main components further contains positive trivalent metal oxide, the amorphous oxide thin film is easily oxidized. Thus, the semiconductor thin film easily becomes amorphous. In addition, the semiconductor thin film can stably function because the oxygen vacancy does not easily occur.

When the amorphous oxide thin film containing zinc oxide and tin oxide as the main components further contains positive trivalent metal oxide such as boron oxide, the amorphous oxide thin film is easily oxidized. Thus, the semiconductor thin film easily becomes amorphous. In addition, the semiconductor thin film can stably function because the oxygen vacancy does not easily occur.

(8) According to the first exemplary embodiment, the amorphous oxide thin film contains indium oxide and tin oxide as the main components, and thus the amorphous oxide thin film is easily oxidized. When indium oxide is referred to as In and tin oxide is referred to as Sn, the atomic ratio of $In/(In +Sn)$ is 0.2 or more and 0.8 or less. Thus, the semiconductor thin film has high mobility and becomes amorphous.

When the amorphous oxide thin film containing indium oxide and tin oxide as the main components further contains positive trivalent metal oxide other than indium oxide, the semiconductor thin film easily becomes amorphous. In addition, the semiconductor thin film can stably function because the oxygen vacancy does not easily occur.

In the amorphous oxide thin film containing indium oxide and tin oxide as the main components and further containing positive trivalent metal oxide other than indium oxide, the positive trivalent metal oxide is, for instance, boron oxide. Thus, the semiconductor thin film easily becomes amorphous. In addition, the semiconductor thin film can stably function because the oxygen vacancy does not easily occur.

The amorphous oxide thin film containing indium oxide and tin oxide as the main components further contains positive divalent metal oxide. Thus, the amorphous oxide thin film maintains a stable amorphous structure. Since the amorphous oxide thin film is easily oxidized, the semiconductor thin film easily becomes amorphous. In addition, the semiconductor thin film can stably function because the oxygen vacancy does not easily occur.

In the amorphous oxide thin film containing indium oxide and tin oxide as the main components and further containing positive divalent metal oxide, the positive divalent metal oxide is at least one or more of zinc oxide and magnesium oxide. Thus, the mobility of carriers is not easily reduced in the amorphous oxide thin film. Since the amorphous oxide thin film is effectively oxidized, the semiconductor thin film becomes amorphous.

Second Exemplary Embodiment

While the amorphous oxide thin film containing the amorphous oxide is exposed to the oxygen plasma generated by exciting an oxygen-containing gas in high frequency so as to form an amorphous semiconductor thin film in the first exemplary embodiment, an amorphous oxide thin film containing an amorphous oxide is exposed to an oxygen plasma generated by exciting an oxygen-containing gas so as to form a crystalline semiconductor thin film in a second exemplary embodiment.

The second exemplary embodiment of the invention will be described below.

In the second exemplary embodiment, the description of the same contents as in the first exemplary embodiment will be omitted or simplified.

[Amorphous Oxide Thin Film]

An amorphous oxide thin film of the second exemplary embodiment contains amorphous indium oxide as a main component. Specifically, the amorphous oxide thin film contains 50 mass % or more of indium oxide. The content of indium oxide is preferably 70 mass % or more, more preferably 80 mass % or more.

The amorphous indium oxide contained in the amorphous oxide thin film may be an amorphous material containing fine crystals or a completely amorphous material.

The amorphous oxide thin film of the second exemplary embodiment contains positive divalent metal oxide.

Examples of the positive divalent metal oxide include zinc oxide, magnesium oxide, nickel oxide, copper oxide and cobalt oxide.

The amorphous oxide thin film may contain one of the above positive divalent metal oxides, or may contain two or more thereof.

The additive amount of the positive divalent metal oxide is not particularly limited as long as crystallization of indium oxide by an oxygen plasma is not inhibited, but, for instance, the additive amount is preferably less than 10 mass % in total metal oxides.

When the additive amount is 10 mass % or more, indium oxide may not be crystallized or it may take too much time for crystallization.

Also, the amorphous oxide thin film of the second exemplary embodiment contains positive trivalent metal oxide.

Examples of the positive trivalent metal oxide include boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

The amorphous oxide thin film may contain one of the above positive trivalent metal oxides, or may contain two or more thereof.

The additive amount of the positive trivalent metal oxide is not particularly limited as long as the crystallization of indium oxide by the oxygen plasma is not inhibited, but, for instance, the additive amount is preferably less than 10 mass % in total metal oxides.

When the additive amount is 10 mass % or more, indium oxide may not be crystallized or it may take too much time for crystallization.

The amorphous oxide thin film of the second exemplary embodiment is formed on a substrate in the same manner as in the first exemplary embodiment.

Incidentally, the amorphous oxide thin film of the second exemplary embodiment is preferably formed by a spattering method so that the film can be formed on a large substrate and have surface smoothness and uniformity.

[Treatment by Oxygen Plasma]

In the second exemplary embodiment, the amorphous oxide thin film is treated by the same oxygen plasma as in the first exemplary embodiment to manufacture a crystalline semiconductor.

The pressure during the treatment of the oxygen plasma in this exemplary embodiment is preferably 5 Pa or more and 0.1 MPa or less, more preferably 50 Pa or more and less than 0.01 Mpa, further more preferably 100 Pa or more and less than 1000 Pa. When the pressure is less than 5 Pa, the crystallization progresses slowly. When the pressure is more than 0.1 MPa, the temperature of the plasma is increased and thus the amorphous oxide thin film is heated.

Advantages of Second Exemplary Embodiment

According to the second exemplary embodiment, the following advantages as well as the above-described advantages (3) and (4) of the first exemplary embodiment can be attained.

(9) According to the second exemplary embodiment, the crystalline indium oxide semiconductor thin film can be obtained by exposing the amorphous oxide thin film containing the above-described amorphous indium oxide as the main component to the oxygen plasma in a high frequency electric field.

In other words, the indium oxide can be crystallized without being heated. Thus, a crystalline semiconductor thin film having high stability against heat and prolonged energization can be obtained.

Also, the oxygen vacancy is reduced during the crystallization of indium oxide because oxygen is fixed to the crystalline semiconductor thin film by the oxygen plasma. Thus, a crystalline semiconductor thin film having excellent semiconductor properties can be obtained.

Since the oxygen fixed by the oxygen plasma is not easily liberated as compared to thermally fixed oxygen, carriers are hardly increased by the liberation of oxygen and thus the semiconductor properties are hardly impaired.

(10) Since the oxygen plasma is generated by exciting the oxygen-containing gas according to the second exemplary embodiment, indium oxide contained in the amorphous oxide thin film is crystallized by the oxygen plasma and excited oxygen atoms are incorporated into the amorphous oxide thin film. Accordingly, the oxygen vacancy can be reduced when indium oxide is crystallized. Thus, a crystalline semiconductor thin film that stably functions can be obtained.

Since the oxygen fixed by the oxygen plasma is not easily liberated as compared to thermally fixed oxygen, carriers are hardly increased by the liberation of oxygen and thus the semiconductor properties are hardly impaired.

(11) The positive divalent metal oxide contained in the amorphous oxide thin film effectively inhibits the generation of carriers in the second exemplary embodiment. Thus, the semiconductor thin film stably functions for a long period.

Also, since the additive amount of the positive divalent metal oxide is less than 10 mass % in total metal oxides, the crystallization of indium oxide by the oxygen plasma is not easily inhibited.

(12) Since the positive trivalent metal oxide contained in the amorphous oxide thin film reduces the oxygen vacancy during the crystallization of indium oxide in the second exemplary embodiment, the obtained semiconductor thin film stably functions.

Also, since the additive amount of the positive trivalent metal oxide is less than 10 mass % in total metal oxides, the crystallization of indium oxide by the oxygen plasma is not easily inhibited.

EXAMPLES

The above-described embodiments will be described in further detail below with reference to Examples and Comparatives. It should be noted that the invention is not limited to Examples at all.

Examples of First Exemplary Embodiment

Comparative 1-1

With the use of an RF (radio frequency) magnetron sputtering apparatus (manufactured by SHIMADZU CORPORATION, brand name: HMS-552), an indium oxide-gallium oxide-zinc oxide (IGZO) thin film having thickness of 100 nm was formed on a glass by sputtering at room temperature in the presence of argon gas.

A target (manufactured by Idemitsu Kosan Co., Ltd.) was made of indium oxide, gallium oxide and zinc oxide (molar ratio of In:Ga:Zn=1:1:1).

Example 1-1

The IGZO thin film obtained in Comparative 1-1 was exposed for 10 minutes to an oxygen plasma generated under the condition that frequency was 13.56 MHz, amplifier power was 500 W and oxygen pressure was 330 Pa. During this plasma treatment, the temperature of a substrate was less than 120 degrees C.

Evaluation of IGZO Thin Films of Example 1-1 and Comparative 1-1

X-ray diffraction was conducted on the IGZO thin film as an amorphous oxide thin film obtained in Comparative 1-1 and the IGZO thin film exposed to the oxygen plasma obtained in Example 1-1. The thin film obtained in Comparative 1-1 was amorphous because an X-ray diffraction peak was not observed. The IGZO thin film exposed to the oxygen plasma obtained in Example 1-1 was also amorphous because an X-ray diffraction peak was not observed.

Table 1 shows specific resistances of the IGZO thin film of Example 1-1 and the IGZO thin film of Comparative 1-1.

The IGZO thin film of Example 1-1 had a specific resistance of $4.44 E^{+3}$ Ωcm and the IGZO thin film of Comparative 1-1 had a specific resistance of $2.95 E^{-2}$ Ωcm. The specific resistance of the IGZO thin film of Example 1-1 was larger than the specific resistance of the IGZO thin film of Comparative 1-1 because the IGZO thin film of Example 1-1 was treated by the oxygen plasma. Thus, it was found that the IGZO thin film of Example 1-1 was a semiconductor thin film.

TABLE 1

|  | specific resistance [Ωcm] | carrier density [/cm$^3$] | mobility [cm$^2$/V·sec] |
| --- | --- | --- | --- |
| sputtered IGZO film | 2.95E$^{-2}$ | 1.16E$^{+19}$ | 18.2 |
| plasma-treated IGZO film | 4.44E$^{+3}$ | 1.18E$^{+14}$ | 11.9 |

Table 1 also shows carrier densities and mobilities of the IGZO thin film of Example 1-1 and the IGZO thin film of Comparative 1-1, which were obtained by Hall measurement.

The IGZO thin film of Example 1-1 had a carrier density of $1.18 E^{+14}/cm^3$ and a mobility of 11.9 cm$^2$/V·sec. On other hand, the IGZO thin film of Comparative 1-1 had a carrier density of $1.16 E^{+19}/cm^3$ and a mobility of 18.2 cm$^2$/V·sec.

Accordingly, it was found that the IGZO thin film of Example 1-1, the carrier density of which was lower than that of the IGZO thin film of Comparative 1-1, was obtained by exposing the IGZO thin film of Comparative 1-1 to the oxygen plasma.

Also, it was found that the IGZO thin film of Example 1-1, the mobility of which was lower than that of the IGZO thin film of Comparative 1-1, was obtained by exposing the IGZO thin film of Comparative 1-1 to the oxygen plasma.

Comparative 1-2

The IGZO thin film of Comparative 1-1 was plasma-treated in the presence of normal oxygen.

Example 1-2

The IGZO thin film of Comparative 1-1 was plasma-treated in the presence of isotope $^{18}O_2$.

Evaluation of IGZO Thin Films of Example 1-2 and Comparative 1-2

SIMS analysis was conducted on the thin film obtained in Example 1-2 to obtain the ratio of $^{18}O/^{16}O$ in the thin film.

SIMS analysis was also conducted on the thin film obtained in Comparative 1-2 to obtain the ratio of $^{18}O_2$ in the thin film. FIG. 1 shows a relationship of the above measurement results. FIG. 1 shows the increment of $^{18}O$ in Example 1-2 where the plasma-treatment was applied using $^{18}O_2$ oxygen when the ratio of $^{18}O/^{16}O$ in Comparative 1-2 where the plasma-treatment was applied using normal oxygen is $1.0 E^{+0}$. As seen from FIG. 1, $^{18}O$ was observed within 15 nm from the surface in the semiconductor thin film that was plasma-treated using $^{18}O_2$ oxygen. Accordingly, it was found that oxygen was incorporated into the thin film by the plasma treatment. By exposing the amorphous oxide thin film to the oxygen plasma, oxygen was incorporated into the thin film.

From Table 1 and the relationship shown in FIG. 1, it was found that, because oxygen was incorporated into the IGZO thin film exposed to the oxygen plasma, the carrier density was reduced and the specific resistance was increased as compared to those of the IGZO thin film that was not exposed to the oxygen plasma.

Example 1-3 and Comparative 1-3

Except that a target containing indium oxide and zinc oxide (molar ratio of In:Zn=8:2) was used, indium oxide-zinc oxide (IZO) thin films were formed in the same manner as in Example 1-1 and Comparative 1-1.

Evaluation of IZO Thin Films of Example 1-3 and Comparative 1-3

The X-ray diffraction was conducted on the IZO thin film as an amorphous oxide thin film obtained in Comparative 1-3 and the IZO thin film exposed to the oxygen plasma obtained in Example 1-3. The thin film obtained in Comparative 1-3 was amorphous because an X-ray diffraction peak was not observed. The IZO thin film exposed to the oxygen plasma obtained in Example 1-3 was also amorphous because an X-ray diffraction peak was not observed.

Table 2 shows specific resistances of the IZO thin film of Example 1-3 and the IZO thin film of Comparative 1-3.

The IZO thin film of Example 1-3 had a specific resistance of $2.86 E^{+2}$ Ωcm and the IZO thin film of Comparative 1-3 had a specific resistance of $2.56 E^{-4}$ Ωcm. The specific resistance of the IZO thin film of Example 1-3 was larger than the specific resistance of the IZO thin film of Comparative 1-3 because the IZO thin film of Example 1-3 was treated by the oxygen plasma. Thus, it was found that the IZO thin film of Example 1-3 was a semiconductor thin film.

TABLE 2

|  | specific resistance [Ωcm] | carrier density [/cm$^3$] | mobility [cm$^2$/V·sec] |
| --- | --- | --- | --- |
| sputtered IZO film | 2.56E$^{-4}$ | 7.12E$^{+20}$ | 34.2 |
| plasma-treated IZO film | 2.86E$^{+2}$ | 1.95E$^{+15}$ | 11.3 |

Table 2 also shows carrier densities and mobilities of the IZO thin film of Example 1-3 and the IZO thin film of Comparative 1-3, which were obtained by Hall measurement.

The IZO thin film of Comparative 1-3 had a carrier density of $1.95 E^{+15}/cm^3$ and a mobility of 11.3 cm$^2$V·sec. On other hand, the IZO thin film of Comparative 1-3 had a carrier density of $7.12 E^{+20}/cm^3$ and a mobility of 34.2 cm$^2$/V·sec.

Accordingly, it was found that the IZO thin film of Example 1-3, the carrier density of which was lower than that of the IZO thin film of Comparative 1-3, was obtained by exposing the IZO thin film of Comparative 1-3 to the oxygen plasma.

Also, it was found that the IZO thin film of Example 1-3, the mobility of which was lower than that of the IZO thin film of Comparative 1-3, was obtained by exposing the IZO thin film of Comparative 1-3 to the oxygen plasma.

Example 1-4 and Comparative 1-4

Except that a target containing indium oxide, tin oxide and zinc oxide (molar ratio of In:Sn:Zn=1:1:1) was used, indium oxide-tin oxide-zinc oxide (ITZO) thin films were formed in the same manner as in Example 1-1 and Comparative 1-1.

Evaluation of ITZO Thin Films of Example 1-4 and Comparative 1-4

The X-ray diffraction was conducted on the ITZO thin film as an amorphous oxide thin film obtained in Comparative 1-4 and the ITZO thin film exposed to the oxygen plasma obtained in Example 1-4. The ITZO thin film obtained in Comparative 1-4 was amorphous because an X-ray diffraction peak was not observed. The ITZO thin film exposed to the oxygen plasma obtained in Example 1-4 was also amorphous because an X-ray diffraction peak was not observed.

Table 3 shows specific resistances of the ITZO thin film of Example 1-4 and the ITZO thin film of Comparative 1-4.

The ITZO thin film of Example 1-4 had a specific resistance of 6.02 $E^{+0}$ Ωcm and the ITZO thin film of Comparative 1-4 had a specific resistance of 2.63 $E^{-3}$ Ωcm. The specific resistance of the ITZO thin film of Example 1-4 was larger than that of the ITZO thin film of Comparative 1-4 because the ITZO thin film of Example 1-4 was treated by the oxygen plasma. Thus, it was found that the ITZO thin film of Example 1-4 was a semiconductor thin film.

TABLE 3

|  | specific resistance [Ωcm] | carrier density [/cm³] | mobility [cm²/V · sec] |
|---|---|---|---|
| sputtered ITZO film | 2.63E$^{-3}$ | 5.51E$^{+19}$ | 43.1 |
| plasma-treated ITZO film | 6.02E$^{+0}$ | 5.35E$^{+17}$ | 1.94 |

Table 3 also shows carrier densities and mobilities of the ITZO thin film of Example 1-4 and the ITZO thin film of Comparative 1-4, which were obtained by Hall measurement.

The ITZO thin film of Example 1-4 had a carrier density of 5.35 $E^{+17}$/cm³ and a mobility of 1.94 cm²/V·sec. On other hand, the ITZO thin film of Comparative 1-4 had a carrier density of 5.51 $E^{+19}$/cm³ and a mobility of 43.1 cm²/V·sec.

Accordingly, it was found that the ITZO thin film of Example 1-4, the carrier density of which was lower than that of the ITZO thin film of Comparative 1-4, was obtained by exposing the ITZO thin film of Comparative 1-4 to the oxygen plasma.

Also, it was found that the ITZO thin film of Example 1-4, the mobility of which was lower than that of the ITZO thin film of Comparative 1-4, was obtained by exposing the ITZO thin film of Comparative 1-4 to the oxygen plasma.

Example 1-5 and Comparative 1-5

Except that a target containing zinc oxide and tin oxide (molar ratio of Zn:Sn=6:4) was used, zinc oxide-tin oxide (ZTO) thin films were formed in the same manner as in Example 1-1 and Comparative 1-1.

Evaluation of ZTO Thin Films of Example 1-5 and Comparative 1-5

The X-ray diffraction was conducted on the ZTO thin film as an amorphous oxide thin film obtained in Comparative 1-5 and the ZTO thin film exposed to the oxygen plasma obtained in Example 1-5. The ZTO thin film obtained in Comparative 1-5 was amorphous because an X-ray diffraction peak was not observed. The ZTO thin film exposed to the oxygen plasma obtained in Example 1-5 was also amorphous because an X-ray diffraction peak was not observed.

Table 4 shows specific resistances of the ZTO thin film of Example 1-5 and the ZTO thin film of Comparative 1-5.

The ZTO thin film of Example 1-5 had a specific resistance of 1.61 $E^{+1}$ Ωcm, and the ZTO thin film of Comparative 1-5 had a specific resistance of 7.75 $E^{-2}$ Ωcm. The specific resistance of the ZTO thin film of Example 1-5 was larger than that of the ZTO thin film of Comparative 1-5 because the ZTO thin film of Example 1-5 was treated by the oxygen plasma. Thus, it was found that the ZTO thin film of Example 1-5 was a semiconductor thin film.

TABLE 4

|  | specific resistance [Ωcm] | carrier density [/cm³] | mobility [cm²/V · sec] |
|---|---|---|---|
| sputtered ZTO film | 7.75E$^{-2}$ | 4.42E$^{+18}$ | 18.2 |
| plasma-treated ZTO film | 1.61E$^{+1}$ | 2.76E$^{+17}$ | 1.4 |

Table 4 also shows carrier densities and mobilities of the ZTO thin film of Example 1-5 and the ZTO thin film of Comparative 1-5, which were obtained by Hall measurement.

The ZTO thin film of Example 1-5 had a carrier density of 2.76 $E^{+17}$/cm³ and a mobility of 1.4 cm²/V·sec. On other hand, the ZTO thin film of Comparative 1-5 had a carrier density of 4.42 $E^{+18}$/cm³ and a mobility of 18.2 cm²/V·sec.

Accordingly, it was found that the ZTO thin film of Example 1-5, the carrier density of which was lower than that of the ZTO thin film of Comparative 1-5, was obtained by exposing the ZTO thin film of Comparative 1-5 to the oxygen plasma.

Also, it was found that the ZTO thin film of Example 1-5, the mobility of which was lower than that of the ZTO thin film of Comparative 1-5, was obtained by exposing the ZTO thin film of Comparative 1-5 to the oxygen plasma.

Example 1-6 and Comparative 1-6

Except that a target containing zinc oxide, tin oxide and ytterbium oxide (molar ratio of Zn:Sn:Yb=20:76:4) was used, zinc oxide-tin oxide-ytterbium oxide (ZTYbO) thin films were formed in the same manner as in Example 1-1 and Comparative 1-1.

Evaluation of ZTYbO Thin Films of Example 1-6 and Comparative 1-6

The X-ray diffraction was conducted on the ZTYbO thin film as an amorphous oxide thin film obtained in Comparative 1-6 and the ZTYbO thin film exposed to the oxygen plasma obtained in Example 1-6. The ZTYbO thin film obtained in Comparative 1-6 was amorphous because an X-ray diffraction peak was not observed. The ZTYbO thin film exposed to the oxygen plasma obtained in Example 1-6 was also amorphous because an X-ray diffraction peak was not observed.

Table 5 shows specific resistances of the ZTYbO thin film of Example 1-6 and the ZTYbO thin film of Comparative 1-6.

The ZTYbO thin film of Example 1-6 had a specific resistance of 5.61 $E^{+0}$ Ωcm, and the ZTYbO thin film of Comparative 1-6 had a specific resistance of 7.21 $E^{-2}$ Ωcm. The specific resistance of the ZTYbO thin film of Example 1-6 was larger than that of the ZTYbO thin film of Comparative 1-6 because the ZTYbO thin film of Example 1-6 was treated by the oxygen plasma. Thus, it was found that the ZTYbO thin film of Example 1-6 was a semiconductor thin film.

TABLE 5

| | specific resistance [Ωcm] | carrier density [/cm³] | mobility [cm²/V · sec] |
|---|---|---|---|
| sputtered ZTYbO film | $7.21E^{-1}$ | $4.34E^{+18}$ | 1.99 |
| plasma-treated ZTYbO film | $5.61E^{+0}$ | $6.36E^{+17}$ | 1.75 |

Table 5 also shows carrier densities and mobilities of the ZTYbO thin film of Example 1-6 and the ZTYbO thin film of Comparative 1-6, which were obtained by Hall measurement.

The ZTYbO thin film of Example 1-6 had a carrier density of 6.36 $E^{+17}$/cm³ and a mobility of 1.75 cm²/V·sec. On other hand, the ZTYbO thin film of Comparative 1-6 had a carrier density of 4.34 $E^{+18}$/cm³ and a mobility of 1.99 cm²/V·sec.

Accordingly, it was found that the ZTYbO thin film of Example 1-6, the carrier density of which was lower than that of the ZTYbO thin film of Comparative 1-6, was obtained by exposing the ZTYbO thin film of Comparative 1-6 to the oxygen plasma.

Also, it was found that the ZTYbO thin film of Example 1-6, the mobility of which was lower than that of the ZTYbO thin film of Comparative 1-6, was obtained by exposing the ZTYbO thin film of Comparative 1-6 to the oxygen plasma.

Example 1-7 and Comparative 1-7

Except that a target containing indium oxide and tin oxide (molar ratio of In:Sn=60:40) was used, indium oxide-tin oxide (ITO) thin films were formed in the same manner as in Example 1-1 and Comparative 1-1.

Evaluation of ITO Thin Films of Example 1-7 and Comparative 1-7

The X-ray diffraction was conducted on the ITO thin film as an amorphous oxide thin film obtained in Comparative 1-7 and the ITO thin film exposed to the oxygen plasma obtained in Example 1-7. The ITO thin film obtained in Comparative 1-7 was amorphous because an X-ray diffraction peak was not observed. The ITO thin film exposed to the oxygen plasma obtained in Example 1-7 was also amorphous because an X-ray diffraction peak was not observed.

Table 6 shows specific resistances of the ITO thin film of Example 1-7 and the ITO thin film of Comparative 1-7.

The ITO thin film of Example 1-7 had a specific resistance of 1.66 $E^{+0}$ Ωcm and the ITO thin film of Comparative 1-7 had a specific resistance of 8.66 $E^{-1}$ Ωcm. The specific resistance of the ITO thin film of Example 1-7 was larger than that of the ITO thin film of Comparative 1-7 because the ITO thin film of Example 1-7 was treated by the oxygen plasma. Thus, it was found that the ITO thin film of Example 1-7 was a semiconductor thin film.

TABLE 6

| | specific resistance [Ωcm] | carrier density [/cm³] | mobility [cm²/V · sec] |
|---|---|---|---|
| sputtered ITO film | $8.66E^{-1}$ | $1.54E^{+20}$ | 46.8 |
| plasma-treated ITO film | $1.66E^{+0}$ | $1.29E^{+17}$ | 2.9 |

Table 6 also shows carrier densities and mobilities of the ITO thin film of Example 1-7 and the ITO thin film of Comparative 1-7, which were obtained by Hall measurement.

The ITO thin film of Example 1-7 had a carrier density of 1.29 $E^{+17}$/cm³ and a mobility of 2.9 cm²/V·sec. On other hand, the ITO thin film of Comparative 1-7 had a carrier density of 1.54 $E^{+18}$/cm³ and a mobility of 46.8 cm²/V·sec.

Accordingly, it was found that the ITO thin film of Example 1-7, the carrier density of which was lower than that of the ITO thin film of Comparative 1-7, was obtained by exposing the ITO thin film of Comparative 1-7 to the oxygen plasma.

Also, it was found that the ITO thin film of Example 1-7, the mobility of which was lower than that of the ITO thin film of Comparative 1-7, was obtained by exposing the ITO thin film of Comparative 1-7 to the oxygen plasma.

Example 1-8 and Comparative 1-8

Except that a target containing indium oxide, tin oxide and samarium oxide (molar ratio of In:Sn:Sm=60:35:5) was used, indium oxide-tin oxide-samarium oxide (ITSmO) thin films were formed in the same manner as in Example 1-1 and Comparative 1-1.

Evaluation of ITSmO Thin Films of Example 1-8 and Comparative 1-8

The X-ray diffraction was conducted on the ITSmO thin film as an amorphous oxide thin film obtained in Comparative 1-8 and the ITSmO thin film exposed to the oxygen plasma obtained in Example 1-8. The ITSmO thin film obtained in Comparative 1-8 was amorphous because an X-ray diffraction peak was not observed. The ITSmO thin film exposed to the oxygen plasma obtained in Example 1-8 was also amorphous because an X-ray diffraction peak was not observed.

Table 7 shows specific resistances of the ITSmO thin film of Example 1-8 and the ITSmO thin film of Comparative 1-8.

The ITSmO thin film of Example 1-8 had a specific resistance of 7.07 $E^{+1}$ Ωcm and the ITSmO thin film of Comparative 1-8 had a specific resistance of 7.95 $E^{-3}$ Ωm. The specific resistance of the ITSmO thin film of Example 1-8 was larger than that of the ITSmO thin film of Comparative 1-8 because the ITSmO thin film of Example 1-8 was treated by the oxygen plasma. Thus, it was found that the ITSmO thin film of Example 1-8 was a semiconductor thin film.

TABLE 7

| | specific resistance [Ωcm] | carrier density [/cm³] | mobility [cm²/V · sec] |
|---|---|---|---|
| sputtered ITSmO film | $7.95E^{-3}$ | $1.76E^{+19}$ | 44.6 |
| plasma-treated ITSmO film | $7.07E^{+1}$ | $6.02E^{+17}$ | 14.6 |

Table 7 also shows carrier densities and mobilities of the ITSmO thin film of Example 1-8 and the ITSmO thin film of Comparative 1-8, which were obtained by Hall measurement.

The ITSmO thin film of Example 1-8 had a carrier density of 6.02 $E^{+17}$/cm$^3$ and a mobility of 14.6 cm$^2$/V·sec. On other hand, the ITSmO thin film of Comparative 1-8 had a carrier density of 1.76 $E^{+19}$/cm$^3$ and a mobility of 44.6 cm$^2$/V·sec.

Accordingly, it was found that the ITSmO thin film of Example 1-8, the carrier density of which was lower than that of the ITSmO thin film of Comparative 1-8, was obtained by exposing the ITSmO thin film of Comparative 1-8 to the oxygen plasma.

Also, it was found that the ITSmO thin film of Example 1-8, the mobility of which was lower than that of the ITSmO thin film of Comparative 1-8, was obtained by exposing the ITSmO thin film of Comparative 1-8 to the oxygen plasma.

Example 1-9 and Comparative 1-9

Except that a spattering target containing indium oxide and samarium oxide (molar ratio of In:Sm=90:10) was used, indium oxide-samarium oxide (ISmO) thin films were formed in the same manner as in Example 1-1 and Comparative 1-1. [Evaluation of ISmO thin films of Example 1-9 and Comparative 1-9]

The X-ray diffraction was conducted on the ISmO thin film as an amorphous oxide thin film obtained in Comparative 1-9 and the ISmO thin film exposed to the oxygen plasma obtained in Example 1-9. The ISmO thin film obtained in Comparative 1-9 was amorphous because an X-ray diffraction peak was not observed. The ISmO thin film exposed to the oxygen plasma obtained in Example 1-9 was also amorphous because an X-ray diffraction peak was not observed.

Table 8 shows specific resistances of the ISmO thin film of Example 1-9 and the ISmO thin film of Comparative 1-9.

The ISmO thin film of Example 1-9 had a specific resistance of 9.53 $E^{+0}$ Ωcm, and the ISmO thin film of Comparative 1-9 had a specific resistance of 5.18 $E^{-2}$ Ωcm. The specific resistance of the ISmO thin film of Example 1-9 was larger than that of the ISmO thin film of Comparative 1-9 because the ISmO thin film of Example 1-9 was treated by the oxygen plasma. Thus, it was found that the ISmO thin film of Example 1-9 was a semiconductor thin film.

TABLE 8

| | specific resistance [Ωcm] | carrier density [/cm$^3$] | mobility [cm$^2$/V · sec] |
|---|---|---|---|
| sputtered ISmO film | 5.18E$^{-2}$ | 4.96E$^{+18}$ | 24.3 |
| plasma-treated ISmO film | 9.53E$^{+0}$ | 4.79E$^{+17}$ | 1.4 |

Table 8 also shows carrier densities and mobilities of the ISmO thin film of Example 1-9 and the ISmO thin film of Comparative 1-9, which were obtained by Hall measurement.

The ISmO thin film of Comparative 1-9 had a carrier density of 4.79 $E^{+17}$/cm$^3$ and a mobility of 1.4 cm$^2$/V·sec. On other hand, the ISmO thin film of Comparative 1-9 had a carrier density of 4.96 $E^{+18}$/cm$^3$ and a mobility of 24.3 cm$^2$/V·sec.

Accordingly, it was found that the ISmO thin film of Example 1-9, the carrier density of which was lower than that of the ISmO thin film of Comparative 1-9, was obtained by exposing the ISmO thin film of Comparative 1-9 to the oxygen plasma.

Also, it was found that the ISmO thin film of Example 1-9, the mobility of which was lower than that of the ISmO thin film of Comparative 1-9, was obtained by exposing the ISmO thin film of Comparative 1-9 to the oxygen plasma.

According to Examples as described above, it was found that a semiconductor thin film having low carrier density and stable semiconductor properties was obtained by the exposure to the oxygen plasma.

Examples of Second Exemplary Embodiment

Comparative 2-1

With the use of an RF (radio frequency) magnetron sputtering apparatus (manufactured by SHIMADZU CORPORATION), an indium oxide thin film having thickness of 100 nm was formed on a glass substrate by sputtering in the presence of argon gas with different oxygen concentration at room temperature.

A target was made of only indium oxide.

Four types of indium oxide thin films were obtained by adjusting the oxygen concentration to 0%, 3%, 5% and 10% during film formation.

Example 2-1

The indium oxide thin films of Comparative 2-1 were used as base thin films. These base thin films were exposed for 10 minutes to a plasma generated under the condition that frequency was 13.56 MHz, amplifier power was 500 W and oxygen pressure was 330 Pa.

Evaluation of Indium Thin Films of Example 2-1 and Comparative 2-1

Figure 2:
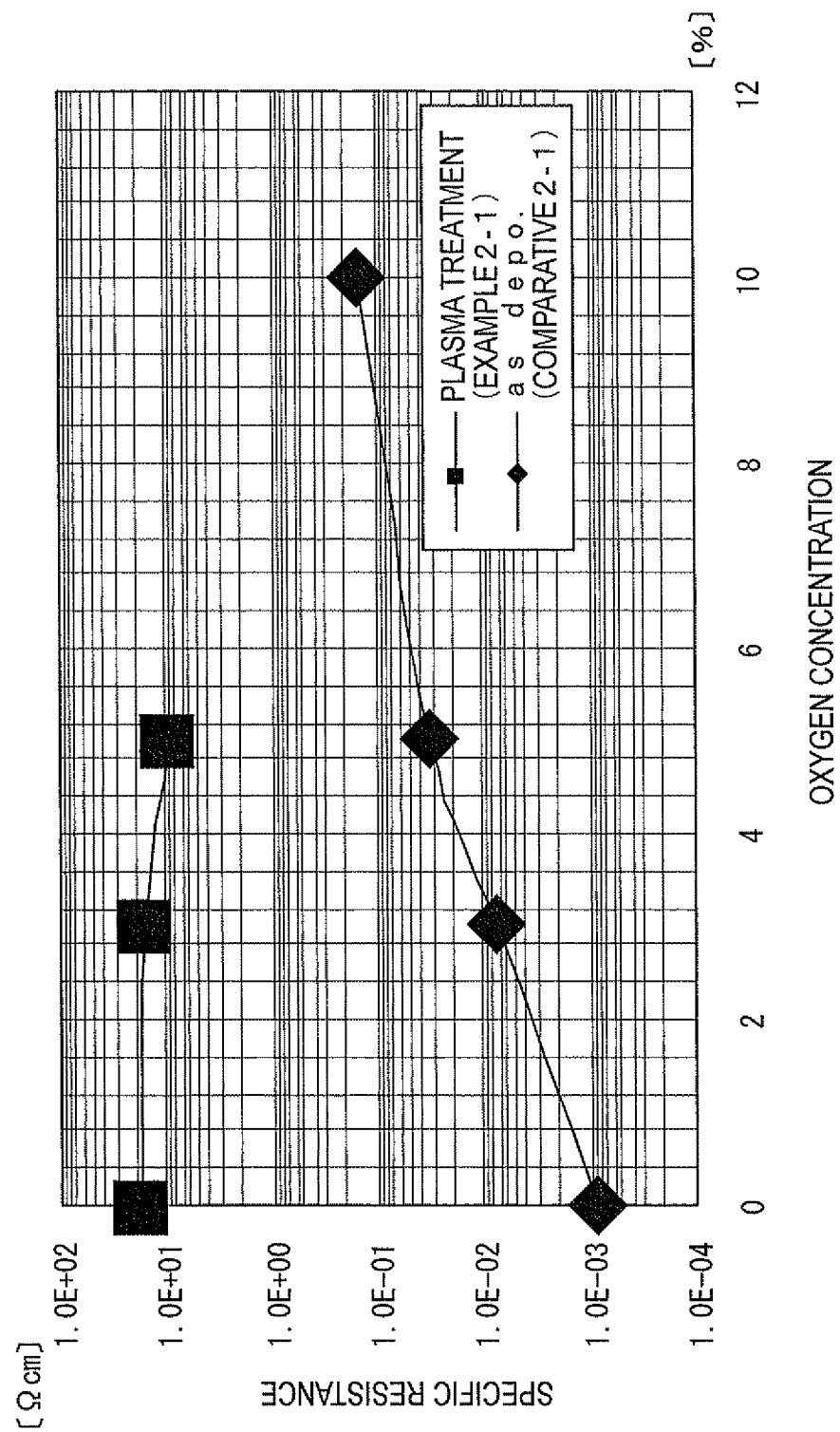
FIG. 2 shows relationships between specific resistances of indium oxide thin films of Example 2-1 and Comparative 2-1 and oxygen concentration during formation of the films according to a second exemplary embodiment of the invention.

FIG. 2 shows relationships between oxygen concentration during the film formation and specific resistances of the formed indium oxide thin films.

In Comparative 2-1, the specific resistance of the indium oxide thin film was increased in accordance with the increase of the oxygen concentration during the film formation.

The specific resistance of the plasma-treated indium oxide thin film of Example 2-1 was 1.0×10$^0$ Ωcm or more, which was larger than that of Comparative 2-1. Accordingly, it was found that the indium oxide thin film obtained in Example 2-1 was a semiconductor thin film.

Figure 3:
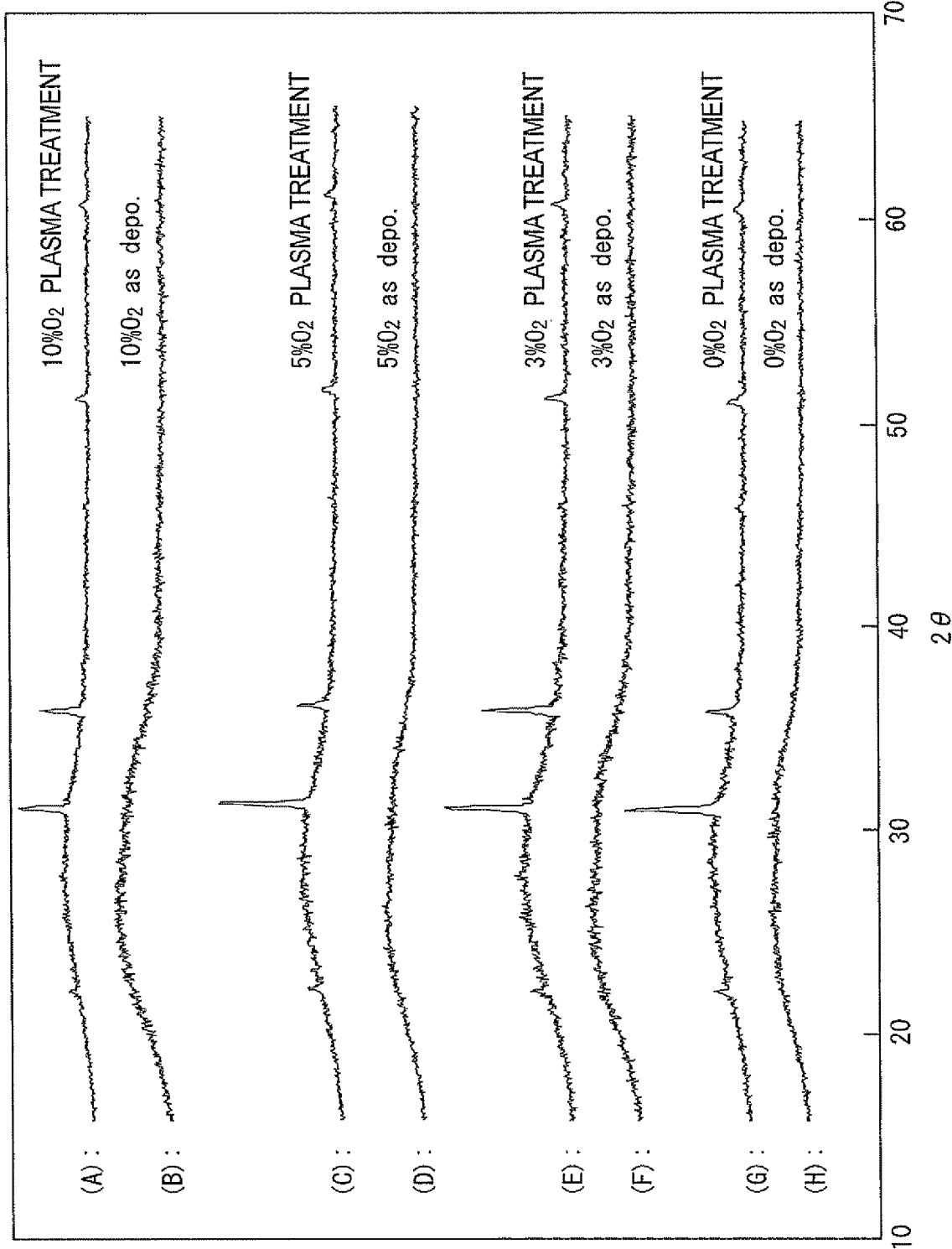
FIG. 3 shows X-ray diffraction patterns of the indium oxide thin films of Example 2-1 and Comparative 2-1 according to the second exemplary embodiment of the invention.

FIG. 3 shows X-ray diffraction patterns of the indium oxide thin films of Example 2-1 and Comparative 2-1.

As is appreciated from FIG. 3, in the indium oxide thin film of Comparative 2-1 (B, D, F, H in FIG. 3), X-ray diffraction peaks were not observed irrespective of oxygen concentration. Accordingly, it was found that the indium oxide thin film of Comparative 2-1 was amorphous.

On the other hand, in the plasma-treated indium oxide thin film of Example 2-1 (A, C, E, G in FIG. 3), X-ray diffraction peaks were observed irrespective of oxygen concentration. Accordingly, it was found that the indium oxide thin film of Example 2-1 was crystalline. At this time, the X-ray diffraction pattern was a diffraction pattern in the bixbyite structure of indium oxide.

Figure 4:
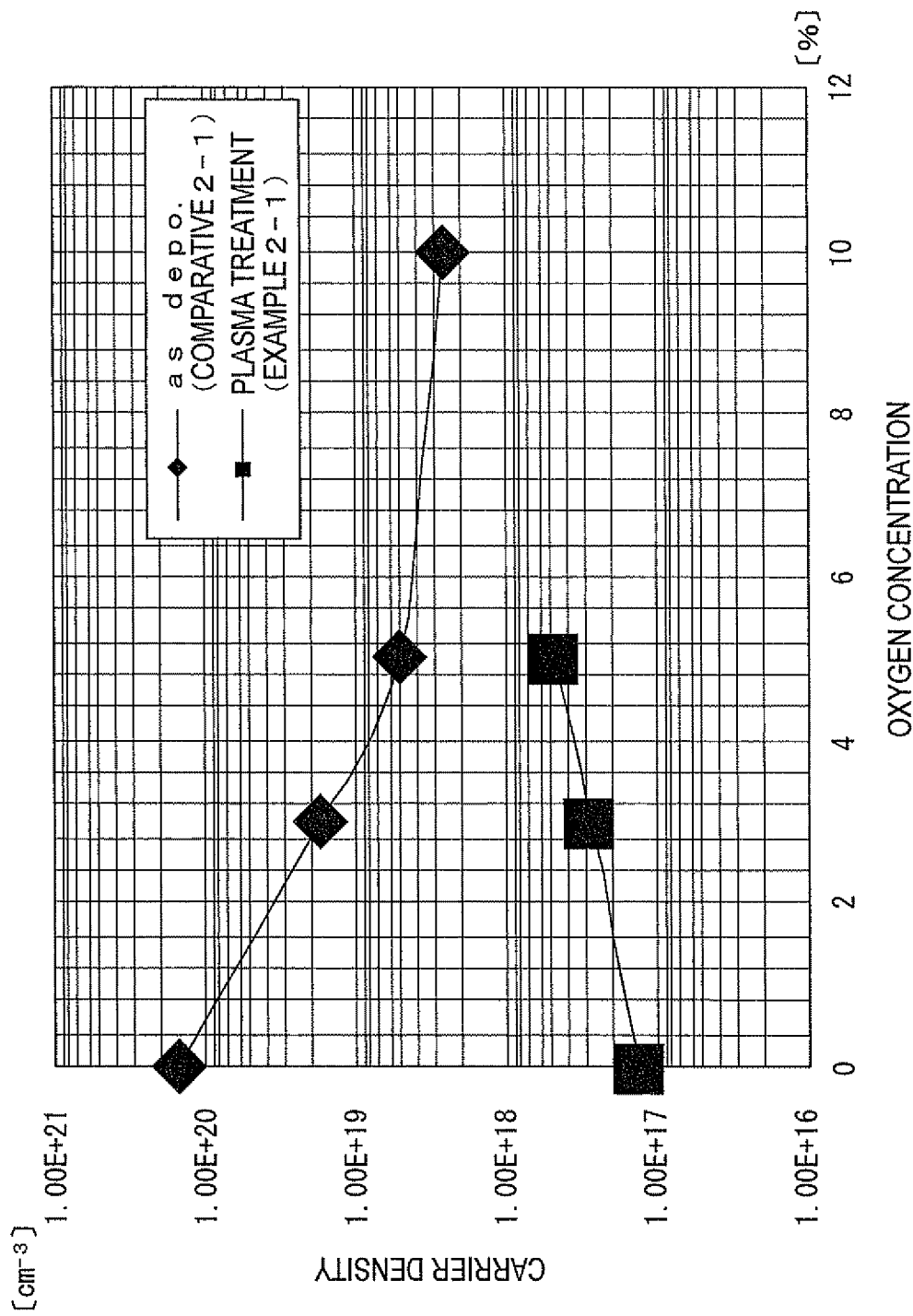
FIG. 4 shows carrier densities of the indium oxide thin films of Example 2-1 and Comparative 2-1 according to the second exemplary embodiment of the invention.
Figure 5:
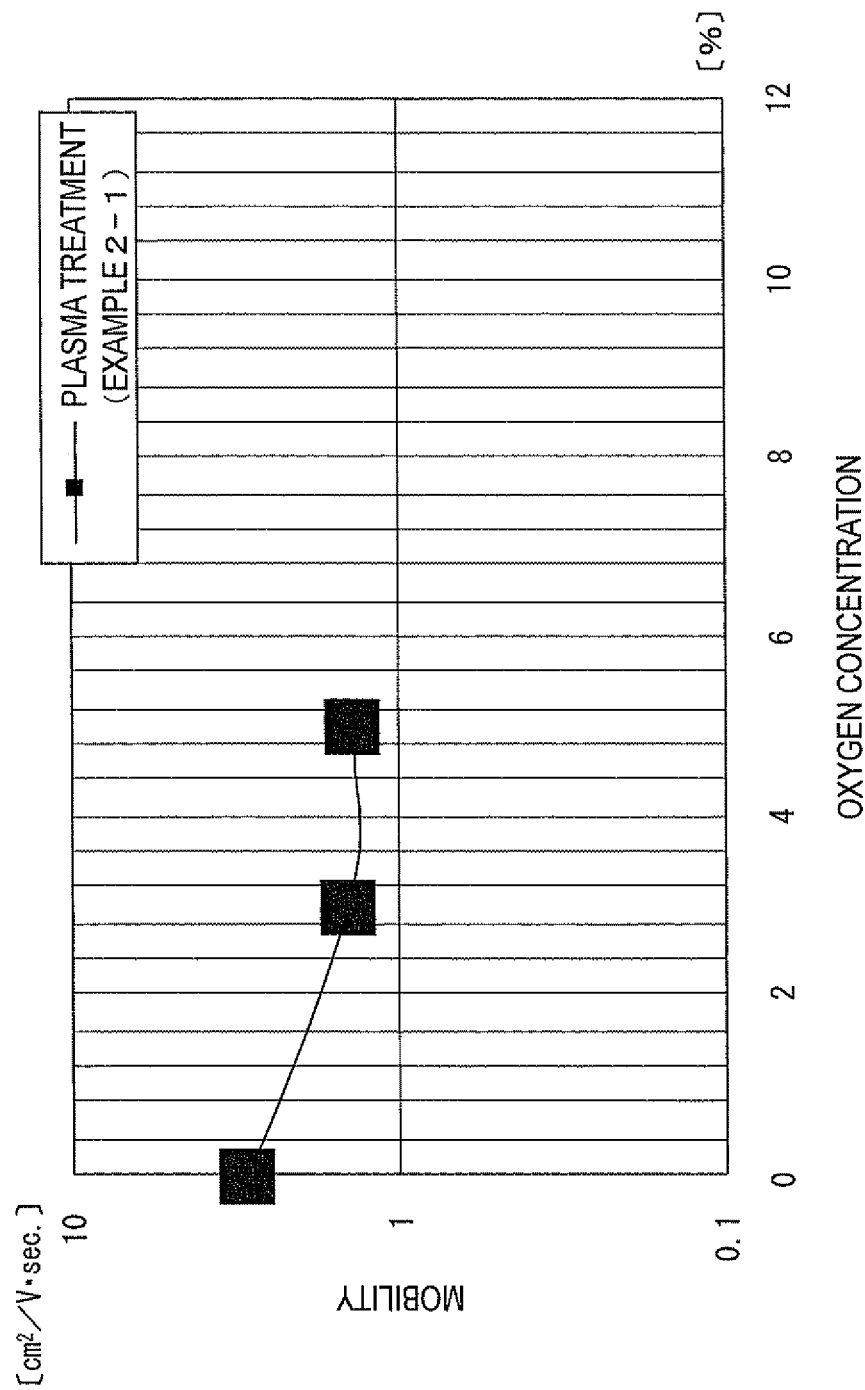
FIG. 5 shows a mobility of the indium oxide thin film of Example 2-1 according to the second exemplary embodiment of the invention.

FIG. 4 and FIG. 5 show carrier densities and mobilities of indium oxide thin films of Example 2-1 and Comparative 2-1, which were obtained by Hall measurement.

As seen from FIG. 4, the carrier density of the indium oxide thin film of Comparative 2-1 was reduced to the order of 1.0×10$^{18}$/cm$^3$ in accordance with the increase of oxygen concentration during the film formation. On the other hand, the carrier density of the plasma-treated indium oxide thin film of Example 2-1 stayed within the order of 1.0×10$^{17}$/cm$^3$. Thus, it was found that the indium oxide thin film of Example 2-1 was effective as a semiconductor.

As seen from FIG. 5, the mobility of the indium oxide thin film was reduced as the oxygen concentration during the film formation was increased. However, the mobility was 1 cm²/V·sec or more, which was larger than that of an amorphous silicon semiconductor thin film.

Example 2-2 and Comparative 2-2

Except that a target made of indium oxide containing 1 to 3 mass % of zinc oxide (manufactured by Idemitsu Kosan Co., Ltd.) was used and oxygen concentration during film formation was fixed at 0%, indium oxide thin films were formed in the same manner as in Example 2-1 and Comparative 2-1.

Evaluation of Indium Oxide Thin Films of Example 2-2 and Comparative 2-2

Figure 6:
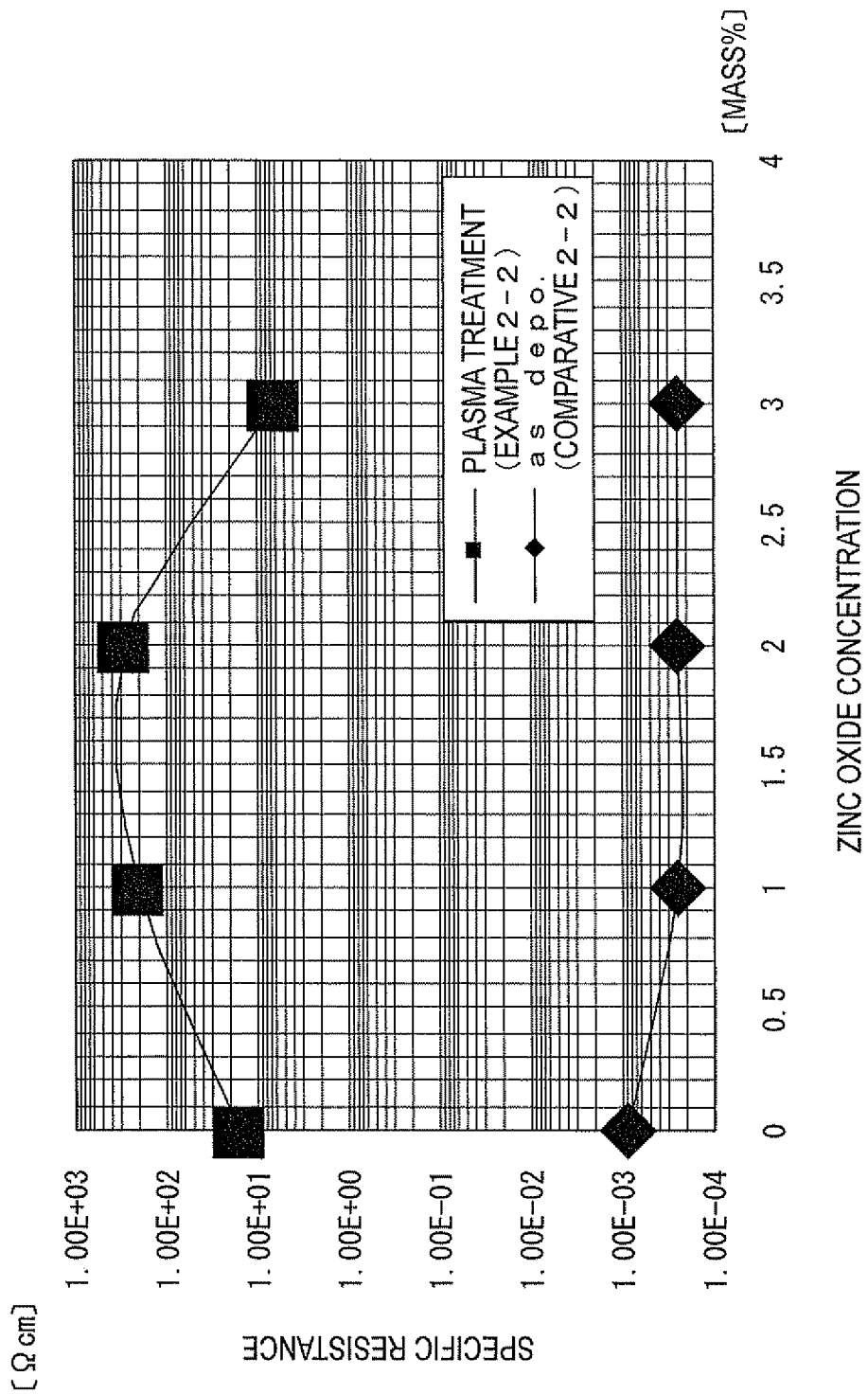
FIG. 6 shows relationships between specific resistances of indium oxide thin films of Example 2-2 and Comparative 2-2 and concentration of zinc oxide according to the second exemplary embodiment of the invention.

FIG. 6 shows relationships between concentration of zinc oxide in the indium oxide films and specific resistances of the indium oxide thin films.

As is appreciated from FIG. 6, the non-plasma-treated indium oxide thin film of Comparative 2-2 had a specific resistance of the order of $1.0 \times 10^{-4}$ Ωm, and thus was a conductive material.

On the other hand, the plasma-treated indium oxide thin film of Example 2-2 had a specific resistance of the order of $1.0 \times 10^{1}$ Ωcm or more, and thus was a semiconductor.

Figure 7:
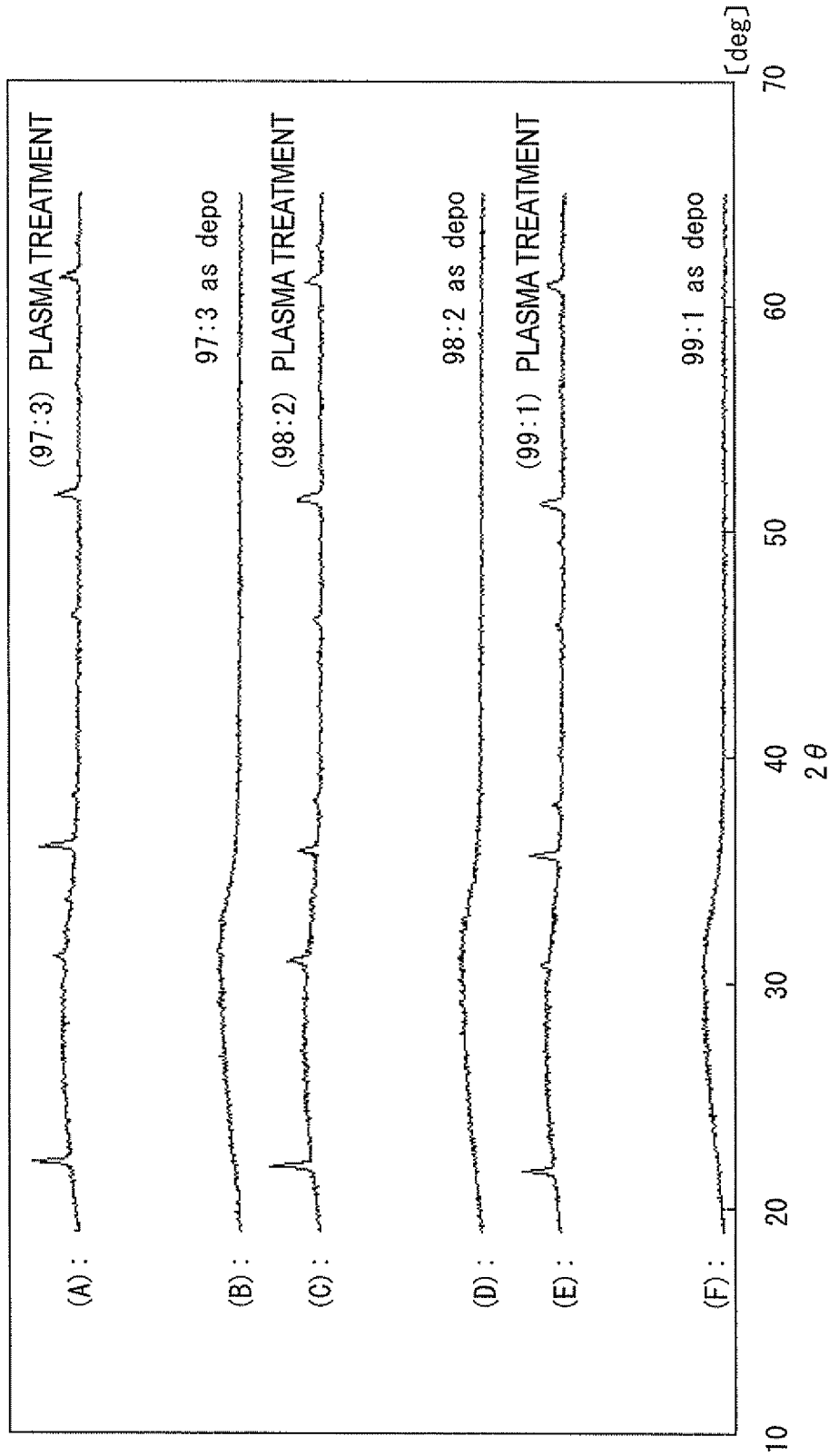
FIG. 7 shows X-ray diffraction patterns of the indium oxide thin films of Example 2-2 and Comparative 2-2 according to the second exemplary embodiment of the invention.

FIG. 7 shows X-ray diffraction patterns of the indium oxide thin films of Example 2-2 and Comparative 2-2.

As is appreciated from FIG. 7, in the indium oxide thin film of Comparative 2-2 (B, D, F in FIG. 7), X-ray diffraction peaks were not observed irrespective of the concentration of zinc oxide. Accordingly, it was found that the indium oxide thin film of Comparative 2-2 was amorphous.

On the other hand, in the plasma-treated indium oxide thin film of Example 2-2 (A, C, E in FIG. 7), X-ray diffraction peaks were observed irrespective of the content of zinc oxide. Accordingly, it was found that the indium oxide thin film of Example 2-2 was crystalline. At this time, the X-ray diffraction pattern was a diffraction pattern in the bixbyite structure of indium oxide.

Figure 8:
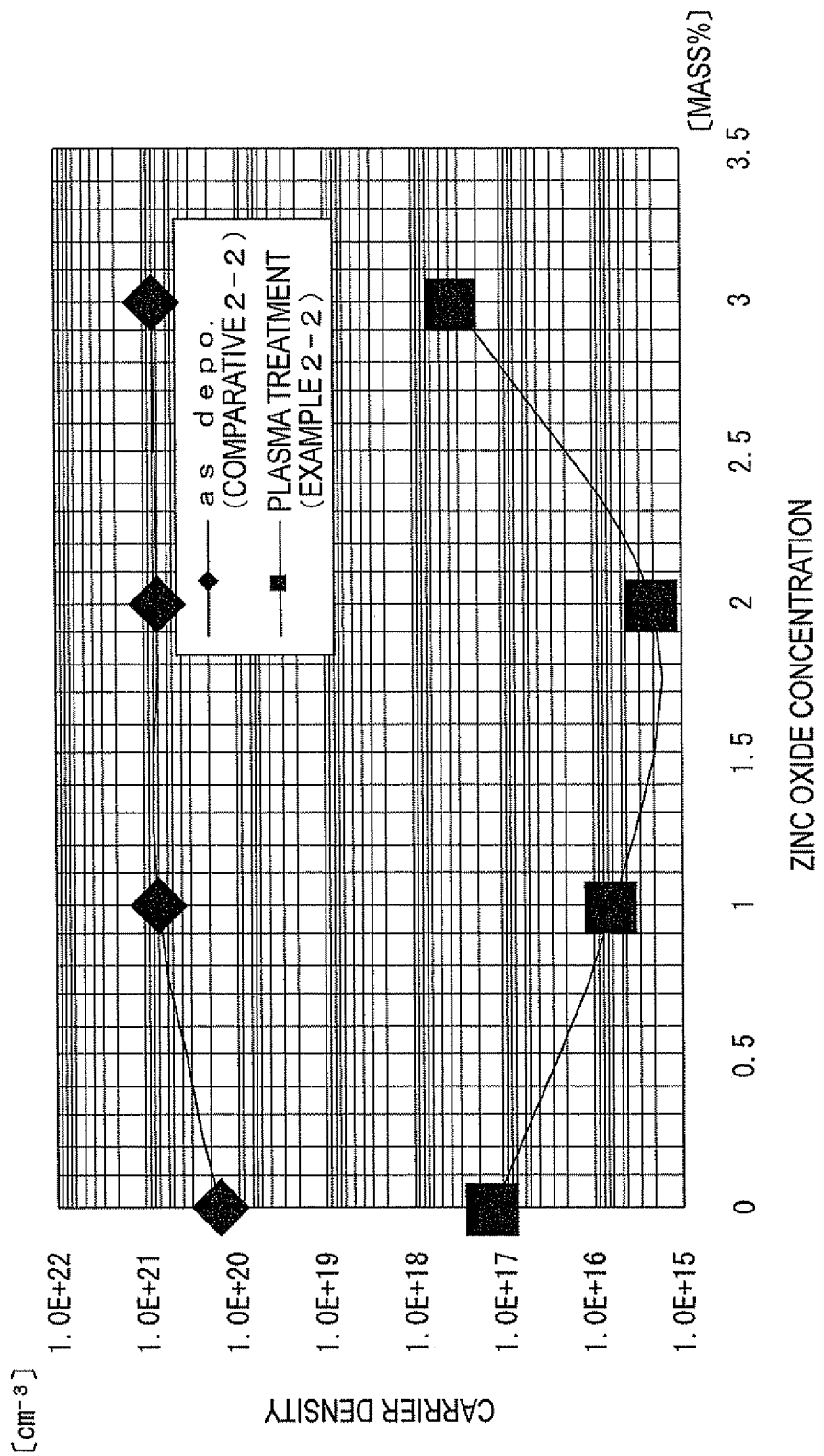
FIG. 8 shows carrier densities of the indium oxide thin films of Example 2-2 and Comparative 2-2 according to the second exemplary embodiment of the invention.
Figure 9:
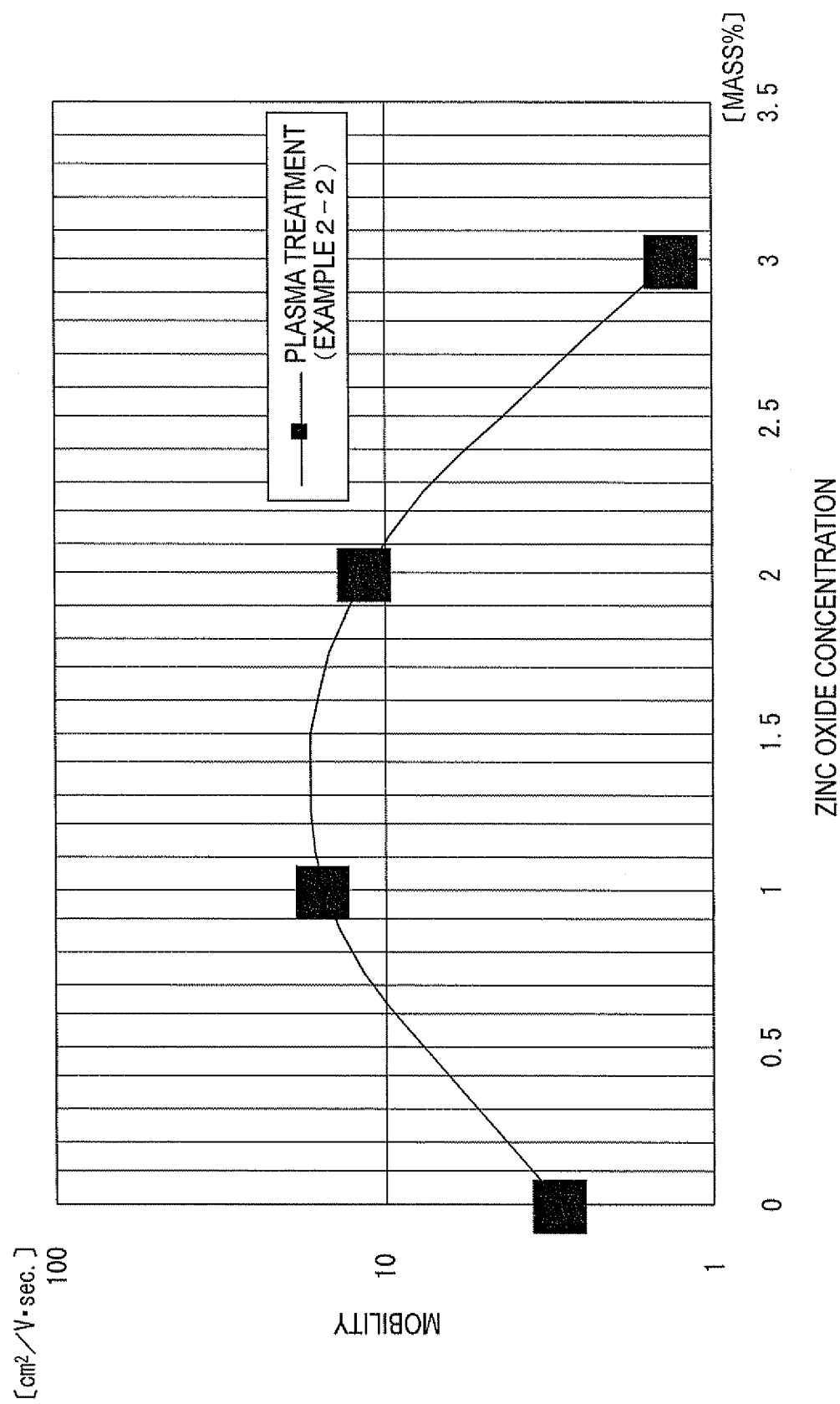
FIG. 9 shows a mobility of the indium oxide thin film of Example 2-2 according to the second exemplary embodiment of the invention.

FIG. 8 and FIG. 9 show carrier densities and mobilities of indium oxide thin films of Example 2-2 and Comparative 2-2.

As seen from FIG. 8, the indium oxide thin film of Comparative 2-2 had a carrier density of the order of $1.0 \times 10^{20}/cm^{3}$ or more, and thus was a conductive material. On the other hand, the plasma-treated indium oxide thin film of Example 2-2 had a carrier density of the order of $1.0 \times 10^{17}/cm^{3}$ or less, and thus was an excellent semiconductor.

As seen from FIG. 9, the plasma-treated indium oxide thin film of Example 2-2 had a mobility of 15 cm²/V·sec or more at the highest. Accordingly, it was found that the indium oxide thin film of Example 2-2 had excellent semiconductor properties and switching properties.

Though zinc oxide was exemplarily used as positive divalent metal oxide in Example 2-2, the same result can be obtained with use of magnesium oxide, cobalt oxide, nickel oxide or copper oxide. According to experiments in which ferric oxide (II), platinum oxide, silver oxide, palladium oxide and auric oxide were used as positive divalent metal oxide, the reduction in the carrier density as shown in FIG. 8 was not observed. Consequently, it was found that zinc oxide, magnesium oxide, cobalt oxide, nickel oxide and copper oxide exhibited excellent addition effect as positive divalent metal oxide.

Example 2-3 and Comparative 2-3

Except that a target made of indium oxide containing 3 mass % of ytterbium oxide was used, indium oxide thin films were formed in the same manner as in Example 2-1 and Comparative 2-1.

Evaluation of Indium Oxide Thin Films of Example 2-3 and Comparative 2-3

Figure 10:
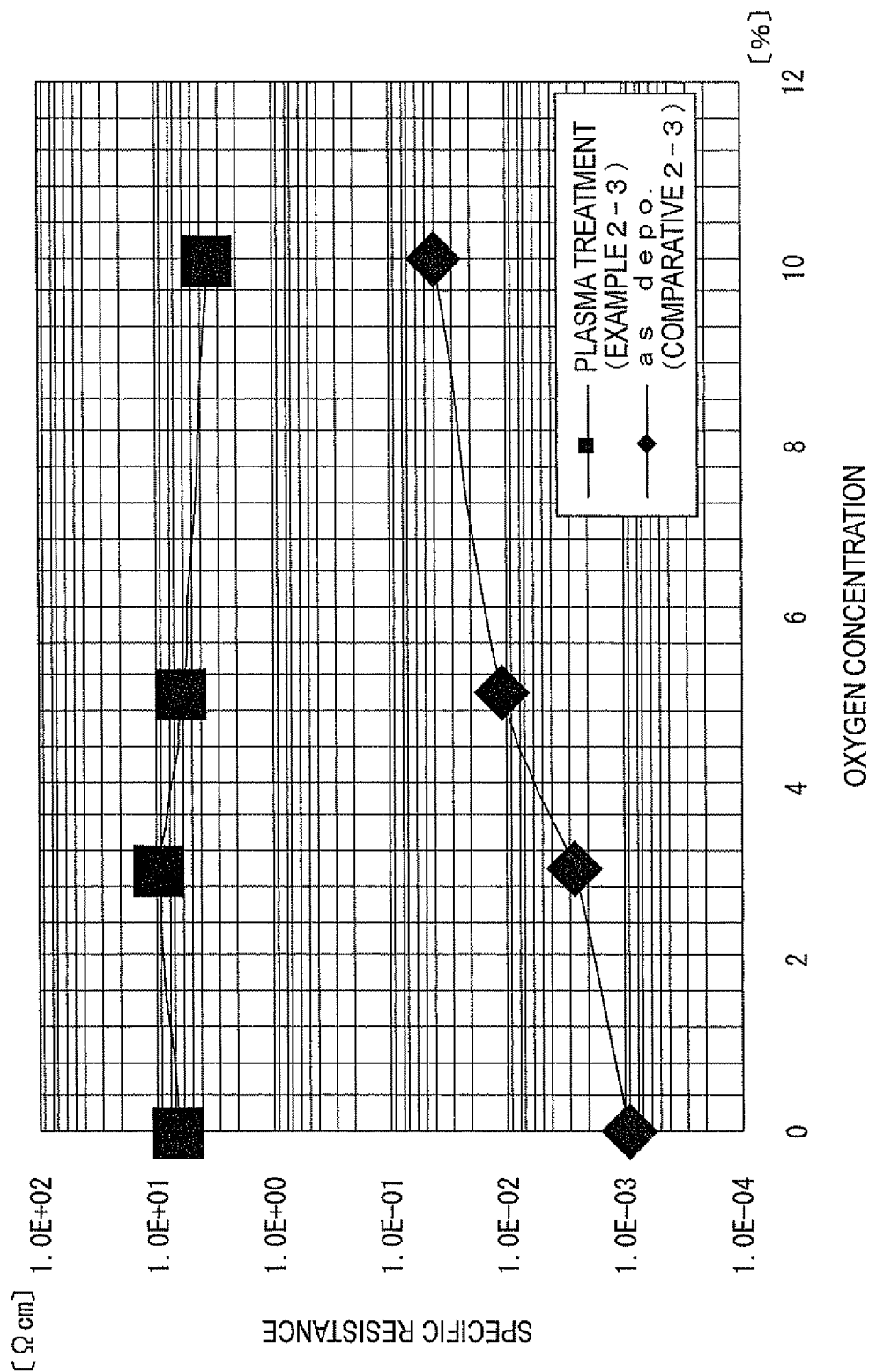
FIG. 10 shows relationships between specific resistances of indium oxide thin films of Example 2-3 and Comparative 2-3 and oxygen concentration during formation of the films according to the second exemplary embodiment of the invention.

FIG. 10 shows relationships between oxygen concentration during film formation and specific resistances of the formed indium oxide thin films.

As is appreciated from FIG. 10, a specific resistance of the indium oxide thin film of Comparative 2-3 changed from the order of $1.0 \times 10^{-3}$ Ωcm to the order of $1.0 \times 10^{-2}$ Ωcm in accordance with the increase of the oxygen concentration during the film formation. Despite the changes, the indium oxide thin film of Comparative 2-3 was a conductive material.

On the other hand, the indium oxide thin film of Example 2-3 had a specific resistance of the order of $1.0 \times 10^{0}$ Ωcm or more, and thus was a semiconductor.

Figure 11:
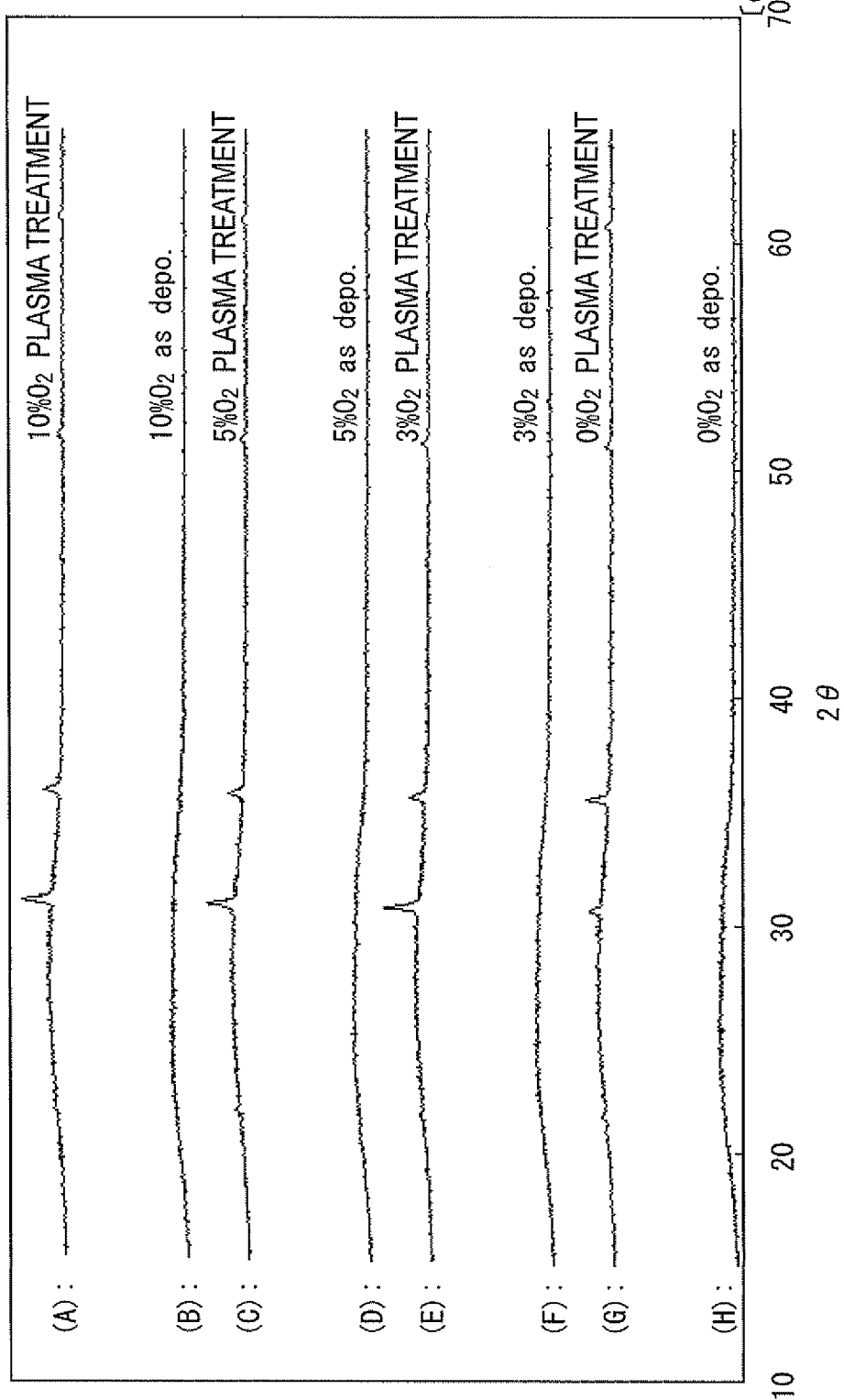
FIG. 11 shows X-ray diffraction patterns of the indium oxide thin films of Example 2-3 and Comparative 2-3 according to the second exemplary embodiment of the invention.

FIG. 11 shows X-ray diffraction patterns of the indium oxide thin films of Example 2-3 and Comparative 2-3.

As is appreciated from FIG. 11, in the indium oxygen thin film of Comparative 2-3 (B, D, F, H in FIG. 11), X-ray diffraction peaks were not observed irrespective of oxygen concentration. Accordingly, it was found that the indium oxygen thin film of Comparative 2-3 was amorphous.

On the other hand, in the plasma-treated indium oxide thin film of Example 2-3 (A, C, E, G in FIG. 11), X-ray diffraction peaks were observed irrespective of oxygen concentration. Accordingly, it was found that the indium oxygen thin film of Example 2-3 was crystalline. At this time, the X-ray diffraction pattern was a diffraction pattern in the bixbyite structure of indium oxide.

Figure 12:
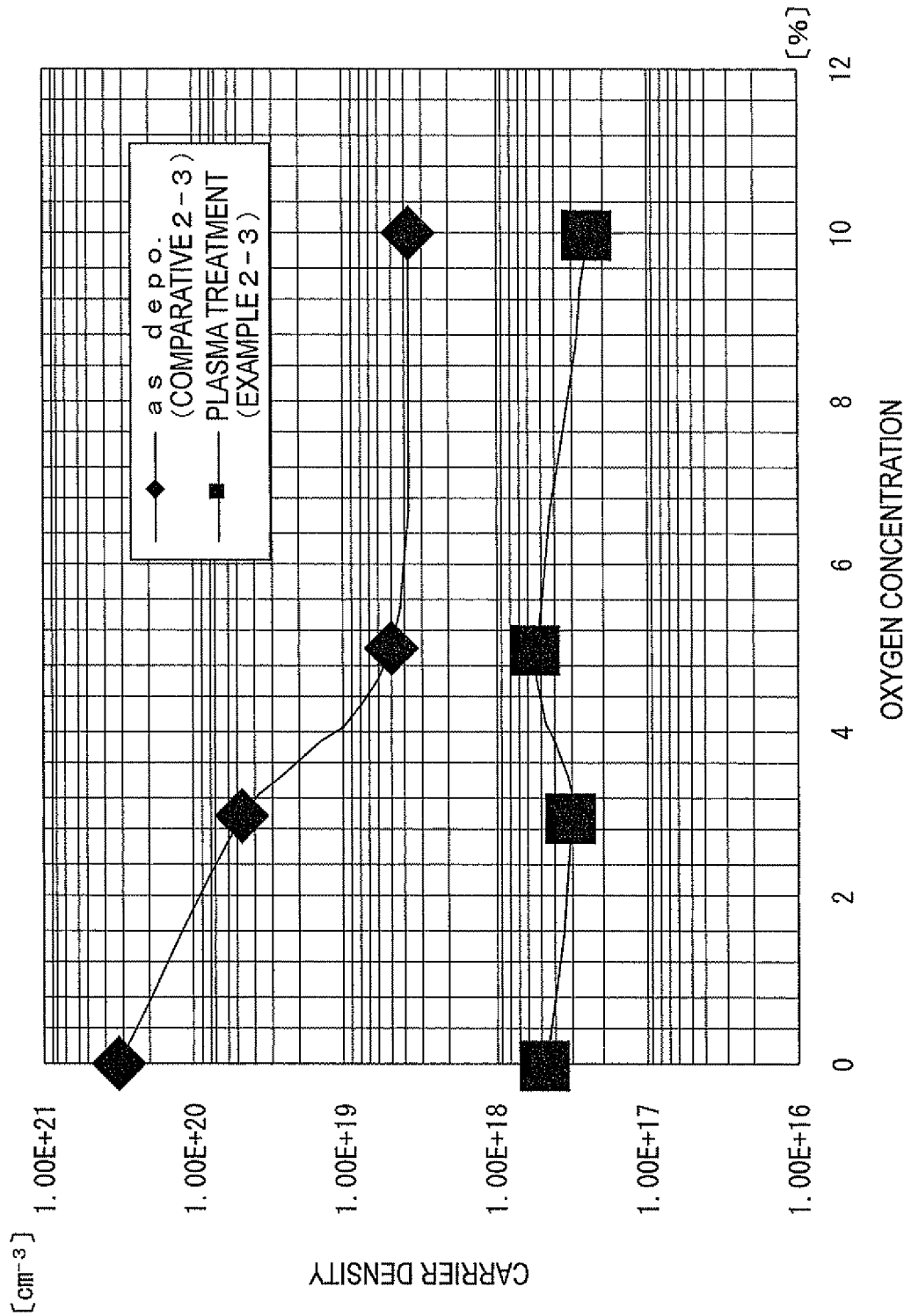
FIG. 12 shows carrier densities of the indium oxide thin films of Example 2-3 and Comparative 2-3 according to the second exemplary embodiment of the invention.
Figure 13:
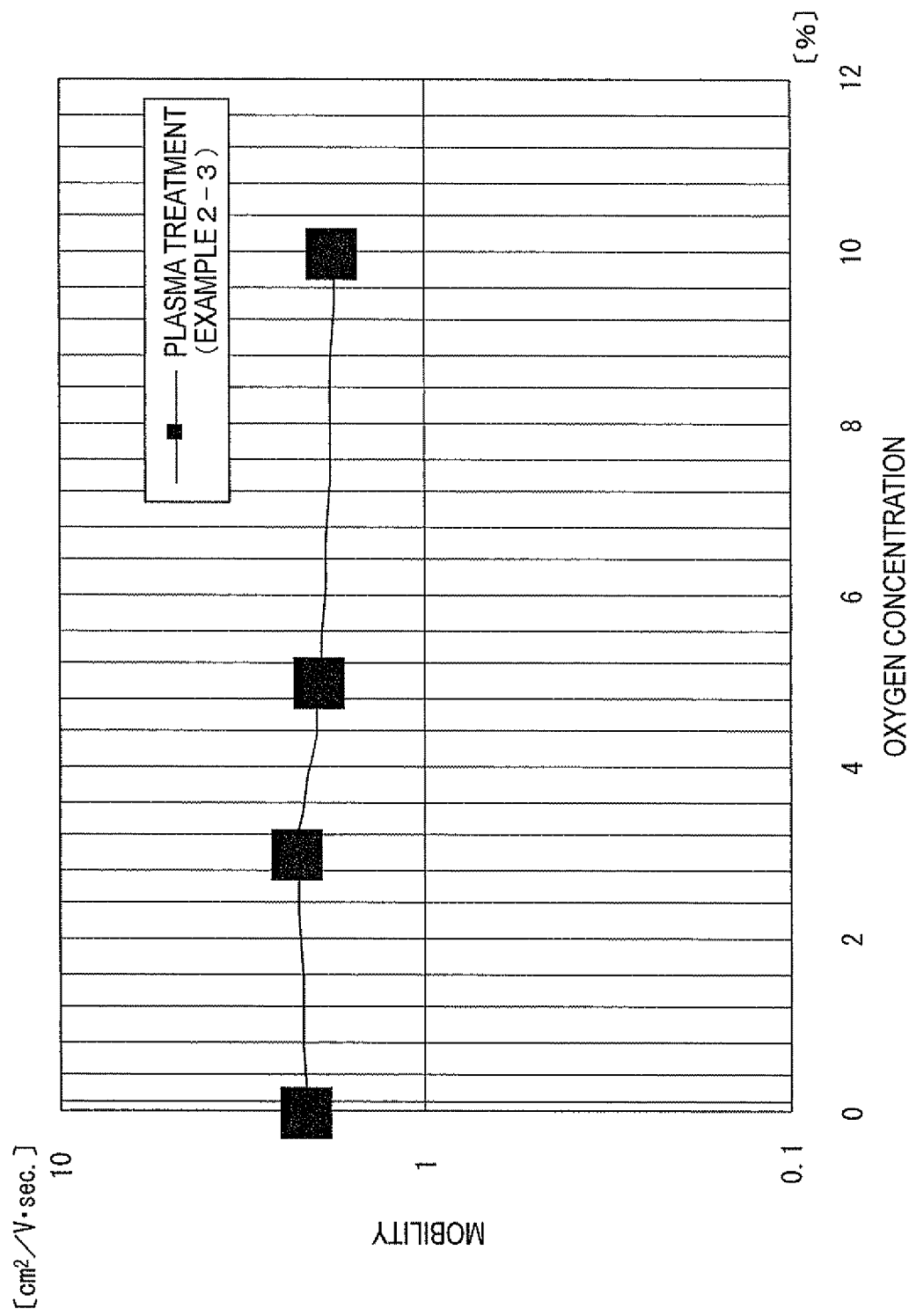
FIG. 13 shows a mobility of the indium oxide thin film of Example 2-3 according to the second exemplary embodiment of the invention.

FIGS. 12 and 13 show carrier densities and mobilities of the indium oxide thin films of Example 2-3 and Comparative 2-3.

As is appreciated from FIG. 12, the carrier density of the indium oxide thin film of Comparative 2-3 changed from the order of $1.0 \times 10^{20}/cm^{3}$ to the order of $1.0 \times 10^{18}/cm^{3}$. Despite the changes, the indium oxide thin film of Comparative 2-3 was a conductive material. On the other hand, the carrier density of the plasma-treated indium oxide thin film of Example 2-3 was of the order of $1.0 \times 10^{17}/cm^{3}$. Thus, the indium oxide thin film of Example 2-3 was an excellent semiconductor.

As seen from FIG. 13, the plasma-treated indium oxide thin film of Example 2-3 had a mobility of 2 cm²/V·sec or more at the highest. Accordingly, it was found that the indium oxide thin film of Example 2-3 had excellent semiconductor properties and switching properties.

Though ytterbium oxide was exemplarily used as positive trivalent metal oxide in Example 2-3, the same result can be obtained with use of boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide or lutetium oxide. Incidentally, though thallium oxide may be another example of positive trivalent metal oxide, thallium oxide is considered not to become a semiconductor because a lot of oxygen vacancies are possibly generated.

Example 2-4

Except that a target made of indium oxide containing 3 mass % of zinc oxide and 2 mass % of ytterbium oxide was used and oxygen concentration during film formation was fixed at 1%, an indium oxide thin film was formed in the same manner as in Example 2-1.

As in Example 2-1 and Example 2-3, the indium oxide thin film right after being formed was amorphous in Example 2-4. However, a result of X-ray diffraction measurement showed that the indium oxide thin film of Example 2-4 was crystallized by plasma treatment.

A specific resistance of the indium oxide thin film of Example 2-4 was $1.0 \times 10^1$ Ωcm or more. Accordingly, it was found that the indium oxide thin film of Example 2-4 was effective as a semiconductor. In addition, a carrier density of the indium oxide thin film of Example 2-4 was of the order of $1.0 \times 10^{17}$/cm$^3$ or less. Accordingly, it was found that the indium oxide thin film of Example 2-4 was capable of providing a thin film transistor in a normally off condition.

Though zinc oxide was exemplarily used as positive divalent metal oxide in Example 2-4, the same result can be obtained with use of magnesium oxide, cobalt oxide, nickel oxide or copper oxide. Though ytterbium oxide was exemplarily used as positive trivalent metal oxide, the same result can be obtained with use of boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide or lutetium oxide.

Example 2-5

With the use of a target made of indium oxide including 5 mass % of zinc oxide, an indium oxide thin film having thickness of 50 nm was formed on a glass substrate by sputtering in the presence of argon gas with different oxygen concentration at room temperature.

The formed indium oxide thin film was exposed for 5 minutes to an RF plasma of 13.56 MHz under the condition that oxygen was 100% and inner pressure was 330 Pa. Being plasma-treated with amplifier powers of 100 W, 200 W, 300 W, 400 W and 500 W respectively, five indium oxide thin films were obtained.

Figure 14:
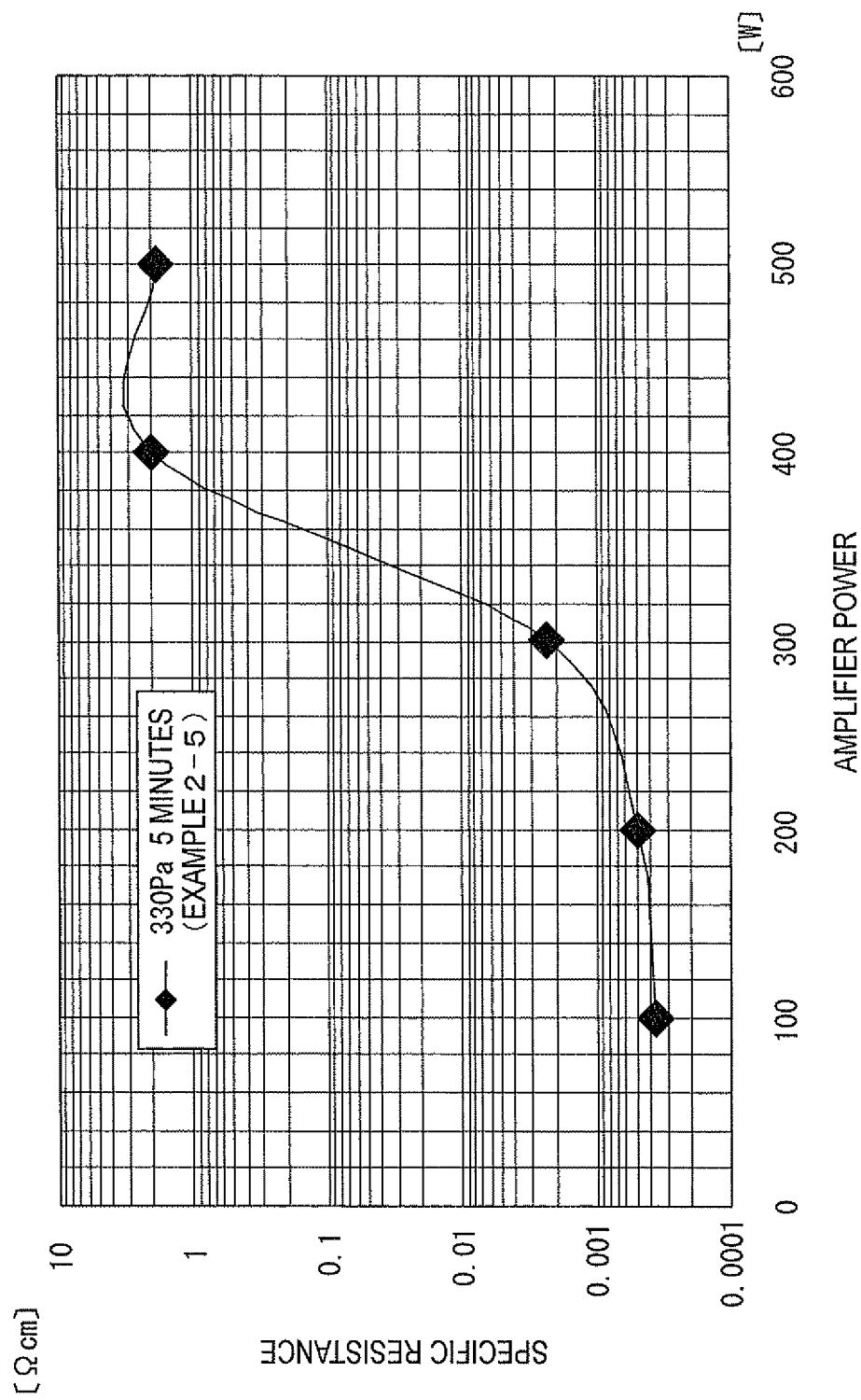
FIG. 14 shows a relationship between a specific resistance of an indium oxide thin film of Example 2-5 and amplifier power in plasma treatment according to the second exemplary embodiment of the invention.

FIG. 14 shows a relationship between the amplifier power during the plasma treatment and specific resistances of the indium oxide thin films.

As seen from FIG. 14, the specific resistance was abruptly increased when the amplifier power in the plasma treatment became approximately 300 W. Further, a result of X-ray diffraction measurement showed that the indium oxide thin films of which specific resistance was increased were crystalline. Incidentally, the amplifier power during the plasma treatment changes depending on the size of a substrate and the volume of space for generating a plasma.

Figure 15:
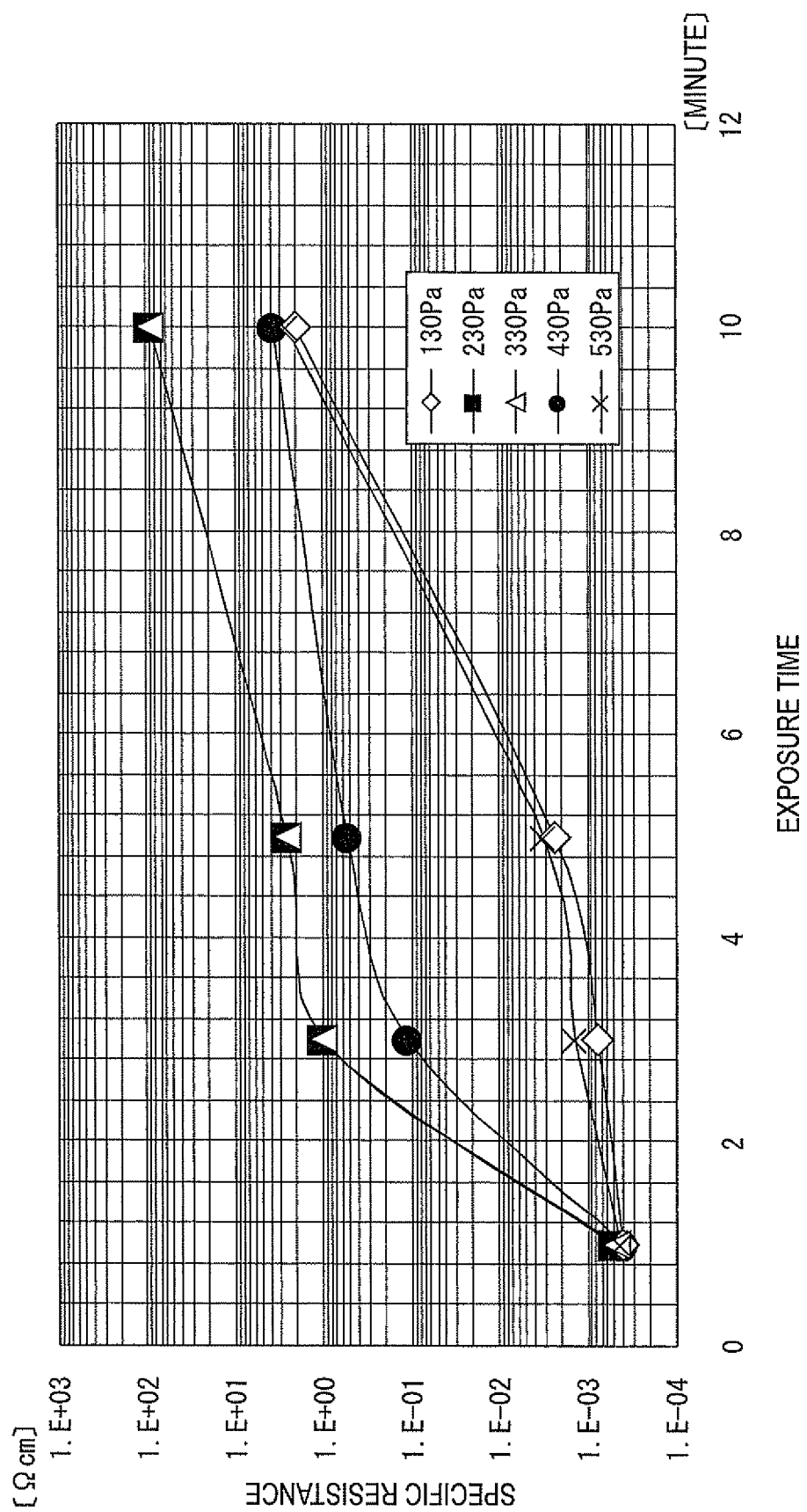
FIG. 15 shows a relationship between the specific resistance of the indium oxide thin film of Example 2-5 and plasma exposed time according to the second exemplary embodiment of the invention.

FIG. 15 shows a relationship between plasma exposed time and a specific resistance of the indium oxide thin film that was plasma-treated with the amplifier power of 500 W while oxygen partial pressure was varied.

When the oxygen partial pressure was 130 Pa or 530 Pa, the specific resistance became $1.0 \times 10^0$ to $1.0 \times 10^2$ Ωcm due to the exposure for approximately 10 minutes and thus the indium oxide thin film was turned into a semiconductor. According to the X-ray diffraction measurement, a crystal peak was observed and it was confirmed that the indium oxide thin film was crystalline.

Example 2-6

Except that a target made of indium oxide containing 1 to 7.5 mass % of zinc oxide was used and oxygen partial pressure was varied during plasma treatment, an indium oxide thin film was formed in the same manner as in Example 2-1 and Comparative 2-1.

Figure 16:
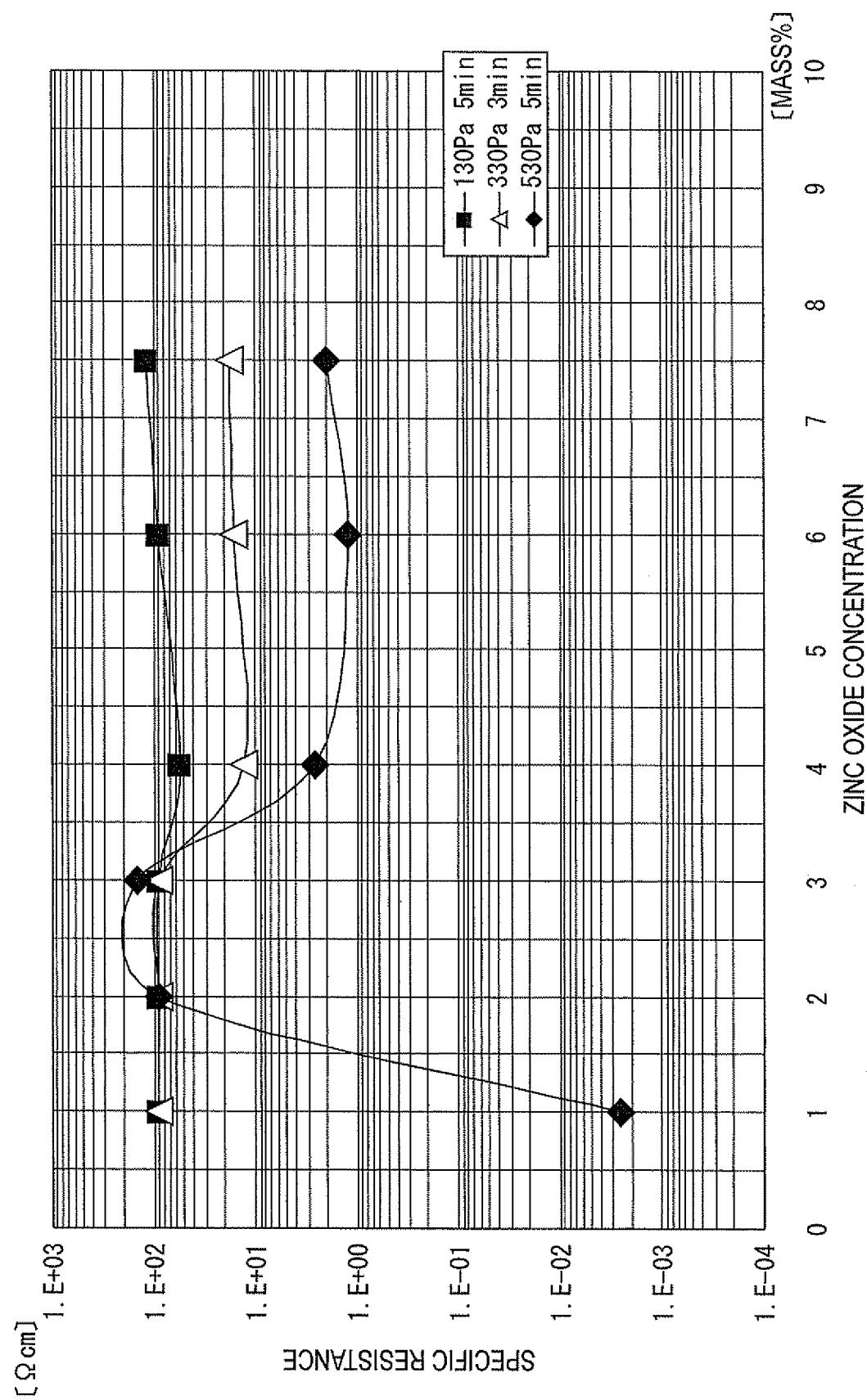
FIG. 16 shows a relationship between a specific resistance of indium oxide thin film of Example 2-6 and zinc oxide concentration according to the second exemplary embodiment of the invention.

FIG. 16 shows a relationship between concentration of zinc oxide and a specific resistance of the indium oxide thin film while the oxygen partial pressure was varied during the plasma treatment.

When the indium oxide thin film was plasma-treated under the oxygen partial pressure of 130 Pa, a specific resistance of the indium oxide thin film was of the order of $1.0 \times 10^2$ Ωcm or more. Thus, the indium oxide thin film was effective as a semiconductor. When the indium oxide thin film was plasma-treated under the oxygen partial pressure of 330 Pa, the specific resistance was of the order of $1.0 \times 10^2$ Ωcm when the concentration of zinc oxide was 3 mass % or less, but was of the order of $1.0 \times 10^1$ Ωcm when the content of zinc oxide was 4 mass % or more. When the indium oxide thin film was plasma-treated under the oxygen partial pressure of 530 Pa, the specific resistance was maximized when the content of zinc oxide was 2 to 3 mass %, and then reduced to the order of $1.0 \times 10^0$ Ωcm. Thus, it was found that the indium oxide thin film was a conductive material.

It should be noted that the invention is not limited to the above-described embodiments, but includes modifications and improvements as long as an object of the invention can be achieved.

Specific materials and processes in carrying out the invention may be altered as long as an object of the invention can be achieved.

Modification of First Exemplary Embodiment

Though the applied frequency is in the range of 1 kHz to 300 MHz, the invention is not limited thereto. For example, the applied frequency may be less than 1 kHz. At this time, the oxidation rate is reduced. Accordingly, a semiconductor thin film having a desired carrier concentration may be obtained by a long process.

On the other hand, the applied frequency may be more than 300 MHz. At this time, the oxidation rate is increased. Accordingly, a semiconductor thin film can be efficiently manufactured, but the selection of substrate needs to be properly made because the substrate may be heated.

Though the amorphous oxide thin film is formed by the sputtering method, ion-plating method, vacuum deposition method, sol-gel method or fine particle application method in the first exemplary embodiment, the invention is not limited thereto. The amorphous oxide thin film may be formed by, for instance, an ARE method, electron beam deposition method, line beam laser deposition method or pulsed laser deposition method. Incidentally, the lower limit of deposition temperature is preferably lower than heat distortion temperature of the substrate.

Though zinc oxide and magnesium oxide are exemplarily used as positive divalent metal oxide in the first exemplary embodiment, the positive divalent metal oxide is not limited thereto.

For instance, the positive divalent metal oxide may be beryllium oxide, calcium oxide, strontium oxide, barium oxide, radium oxide, cadmium oxide or mercury oxide.

Though boron oxide or the like is exemplarily used as positive trivalent metal oxide in the first exemplary embodiment, the positive trivalent metal oxide is not limited thereto.

For instance, the positive trivalent metal oxide may be cerium oxide, praseodymium oxide, promethium oxide or terbium oxide.

Further, though the amorphous oxide thin film containing positive divalent metal oxide and positive trivalent metal oxide is exemplified in the first exemplary embodiment, the amorphous oxide thin film is not limited thereto.

For instance, the amorphous oxide thin film may contain at least one or more of metal oxides such as positive divalent metal oxide, positive trivalent metal oxide, positive tetravalent metal oxide, positive pentavalent metal oxide and positive hexavalent metal oxide.

Though the amorphous oxide thin film contains indium oxide and a positive divalent metal compound as main components in the first exemplary embodiment, the amorphous oxide thin film is not limited thereto.

For instance, the amorphous oxide thin film may contain indium oxide and a positive trivalent metal compound as main components.

Also, though the amorphous thin film contains zinc oxide and tin oxide as main components in the first exemplary embodiment, the amorphous thin film is not limited thereto.

For instance, the amorphous oxide thin film may contain zinc oxide and a positive divalent metal compound as main components. Alternatively, the amorphous oxide thin film may contain zinc oxide and a positive trivalent metal compound as main components. Further, the amorphous oxide thin film may contain tin oxide and a positive divalent metal compound as main components. Furthermore, the amorphous oxide thin film may contain tin oxide and a positive trivalent metal compound as main components.

The conditions for generating the oxygen plasma such as applied frequency and pressure are not limited to those exemplified in the first exemplary embodiment.

Even under other conditions, the same advantages can be attained as in the first exemplary embodiment as long as an oxygen plasma can be generated and an amorphous semiconductor thin film, an electronic carrier concentration of which is reduced by oxidizing an amorphous oxide thin film, can be obtained.

Modification of Second Exemplary Embodiment

Though the amorphous oxide thin film containing positive divalent metal oxide and positive trivalent metal oxide is exemplified in the second exemplary embodiment, the amorphous oxide thin film is not limited thereto.

The amorphous oxide thin film may not contain positive divalent metal oxide or positive trivalent metal oxide, and may contain only either one of them.

Without the above components, indium oxide (i.e., a main component of the amorphous oxide thin film) is nevertheless crystallized by an oxygen plasma and oxygen is fixed to a semiconductor thin film by the oxygen plasma as in the second exemplary embodiment. Thus, the same advantages can be attained as in the second exemplary embodiment.

The conditions for generating the oxygen plasma such as applied frequency, types of gas and pressure are not limited to those exemplified in the second exemplary embodiment.

Even under other conditions, the same advantages can be attained as in the second exemplary embodiment as long as an oxygen plasma can be generated and indium oxide can be crystallized.

The invention claimed is:

1. An amorphous semiconductor thin film, comprising an amorphous oxide thin film containing amorphous oxide, the amorphous semiconductor thin film being amorphous and being obtained by exposing the amorphous oxide thin film to an oxygen plasma generated by exciting an oxygen-containing gas in high frequency, the oxygen plasma being generated under conditions that applied frequency is 1 kHz or more and 300 MHz or less, and pressure is 5 Pa or more and 0.1 MPa or less,
   wherein the amorphous oxide thin film is a thin film containing indium oxide as a main component, and the amorphous oxide thin film additionally contains positive trivalent metal oxide other than indium oxide, and
   wherein the positive trivalent metal oxide is at least one or more of metal oxides selected from boron oxide, aluminum oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

2. The amorphous semiconductor thin film according to claim 1, wherein the amorphous oxide thin film is formed by one of a sputtering method, ion-plating method, vacuum deposition method, sol-gel method and fine particle application method.

3. An amorphous semiconductor thin film, comprising an amorphous oxide thin film containing amorphous oxide, the amorphous semiconductor thin film being amorphous and being obtained by exposing the amorphous oxide thin film to an oxygen plasma generated by exciting an oxygen-containing gas in high frequency, the oxygen plasma being generated under conditions that applied frequency is 1 kHz or more and 300 MHz or less, and pressure is 5 Pa or more and 0.1 MPa or less,
   wherein the amorphous oxide thin film contains indium oxide and magnesium oxide as main components.

4. The amorphous semiconductor thin film according to claim 3, wherein the amorphous oxide thin film additionally contains at least one or more of metal oxides selected from boron oxide, aluminum oxide, gallium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbium oxide and lutetium oxide.

5. An amorphous semiconductor thin film, comprising an amorphous oxide thin film containing amorphous oxide, the amorphous semiconductor thin film being amorphous and being obtained by exposing the amorphous oxide thin film to an oxygen plasma generated by exciting an oxygen-containing gas in high frequency, the oxygen plasma being generated under conditions that applied frequency is 1 kHz or more and 300 MHz or less, and pressure is 5 Pa or more and 0.1 MPa or less,
   wherein the amorphous oxide thin film contains indium oxide and tin oxide as main components, and
   wherein the amorphous oxide thin film additionally contains positive trivalent metal oxides selected from the group consisting of boron oxide, aluminium oxide, scandium oxide, yttrium oxide, lanthanum oxide, neodymium oxide, samarium oxide, europium oxide, gadolinium oxide, dysprosium oxide, holmium oxide, erbium oxide, thulium oxide, ytterbiuim oxide and lutetium oxide.

6. An amorphous semiconductor thin film, comprising an amorphous oxide thin film containing amorphous oxide, the amorphous semiconductor thin film being amorphous and being obtained by exposing the amorphous oxide thin film to an oxygen plasma generated by exciting an oxygen-containing gas in high frequency, the oxygen plasma being generated under conditions that applied frequency is 1 kHz or more and 30 MHz or less, and pressure is 5 Pa or more and 0.1 MPa or less, wherein the amorphous oxide thin film contains indium oxide and tin oxide as main components, and wherein the amorphous oxide thin film contains magnesium oxide as a divalent metal oxide.

* * * * *